(12) United States Patent
Yamazaki et al.

(10) Patent No.: US 8,300,168 B2
(45) Date of Patent: Oct. 30, 2012

(54) DISPLAY DEVICE COMPRISING AN ANTIOXIDANT FILM FORMED ON A MICROCRYSTALLINE SEMICONDUCTOR FILM WHEREIN THE ANTIOXIDANT FILM HAS A RECESSED PORTION OVERLAPPING A CHANNEL REGION

(75) Inventors: Shunpei Yamazaki, Tokyo (JP);
Mitsuhiro Ichijo, Kanagawa (JP);
Tetsuhiro Tanaka, Tochigi (JP);
Takashi Ohtsuki, Kanagawa (JP); Seiji Yasumoto, Tochigi (JP); Kenichi Okazaki, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 211 days.

(21) Appl. No.: 12/213,105

(22) Filed: Jun. 13, 2008

(65) Prior Publication Data

US 2008/0308807 A1    Dec. 18, 2008

(30) Foreign Application Priority Data

Jun. 15, 2007  (JP) ................................. 2007-159372

(51) Int. Cl.
*G02F 1/136* (2006.01)
*G02F 1/1343* (2006.01)

(52) U.S. Cl. ......................................... 349/43; 349/140

(58) Field of Classification Search .................... 349/42, 349/43, 139, 140, 158
See application file for complete search history.

(56) References Cited

U.S. PATENT DOCUMENTS

| | | | |
|---|---|---|---|
| 4,409,134 A | 10/1983 | Yamazaki | |
| 5,453,858 A | 9/1995 | Yamazaki | |
| 5,514,879 A | 5/1996 | Yamazaki | |
| 5,614,732 A | 3/1997 | Yamazaki | |
| 5,701,167 A | 12/1997 | Yamazaki | |
| 5,849,601 A | 12/1998 | Yamazaki | |
| 5,859,445 A | 1/1999 | Yamazaki | |
| 5,932,302 A | 8/1999 | Yamazaki et al. | |

(Continued)

FOREIGN PATENT DOCUMENTS

EP    1505174    2/2005

(Continued)

OTHER PUBLICATIONS

Lee.C et al., Postdeposition Thermal Annealing and Material Stability of 75° C. Hydrogenated Nanocrystalline Silicon Plasma-Enhanced Chemical Vapor Deposition Films, , J. Appl. Phys. (Journal of Applied Physics, Aug. 4, 2005, vol. 98, pp. 034305-1-034305-7.

(Continued)

*Primary Examiner* — Mark Robinson
*Assistant Examiner* — Paul Lee
(74) *Attorney, Agent, or Firm* — Eric J. Robinson; Robinson Intellectual Property Law Office, P.C.

(57) ABSTRACT

It is an object to provide a manufacturing method by which display devices can be manufactured in quantity without degrading the characteristics of thin film transistors. In a display device including a thin film transistor in which a microcrystalline semiconductor film, a gate insulating film in contact with the microcrystalline semiconductor film, and a gate electrode overlap with each other, an antioxidant film is formed on a surface of the microcrystalline semiconductor film. The antioxidant film on the surface of the microcrystalline semiconductor film can prevent a surface of a microcrystal grain from being oxidized, thereby preventing the mobility of the thin film transistor from decreasing.

16 Claims, 21 Drawing Sheets

U.S. PATENT DOCUMENTS

| | | | |
|---|---|---|---|
| 6,011,277 | A | 1/2000 | Yamazaki |
| 6,023,075 | A | 2/2000 | Yamazaki |
| 6,171,674 | B1 | 1/2001 | Yamazaki et al. |
| 6,183,816 | B1 | 2/2001 | Yamazaki et al. |
| 6,252,249 | B1 | 6/2001 | Yamazaki |
| 6,281,520 | B1 | 8/2001 | Yamazaki |
| 6,306,213 | B1 | 10/2001 | Yamazaki |
| 6,468,617 | B1 | 10/2002 | Yamazaki et al. |
| 6,737,676 | B2 | 5/2004 | Yamazaki |
| 6,835,523 | B1 | 12/2004 | Yamazaki et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 2005/0012097 | A1* | 1/2005 | Yamazaki ........................ 257/59 |
| 2005/0022864 | A1 | 2/2005 | Fujioka et al. |
| 2005/0041166 | A1* | 2/2005 | Yamazaki et al. .............. 349/42 |
| 2005/0089648 | A1 | 4/2005 | Yamazaki et al. |
| 2006/0024866 | A1* | 2/2006 | Gan et al. ....................... 438/149 |
| 2006/0238132 | A1 | 10/2006 | Kitamura et al. |
| 2006/0263952 | A1* | 11/2006 | Hiroki et al. ................... 438/149 |
| 2006/0287461 | A1* | 12/2006 | Henze et al. .................... 528/44 |
| 2007/0018165 | A1 | 1/2007 | Yamazaki |

FOREIGN PATENT DOCUMENTS

| | | |
|---|---|---|
| JP | 62-062073 | 12/1987 |
| JP | 02-053941 | 11/1990 |
| JP | 04-242724 | 8/1992 |
| JP | 11-121761 A | 4/1999 |
| JP | 2000-277439 | 10/2000 |
| JP | 2004-014958 | 1/2004 |
| JP | 2005-049832 | 2/2005 |
| JP | 2005-050905 | 2/2005 |
| JP | 2005-167051 | 6/2005 |
| JP | 2007-005705 | 1/2007 |
| JP | 2007-048982 | 2/2007 |

OTHER PUBLICATIONS

Lee.C et al., "Directly Deposited Nanocrystalline Silicon Thin-Film Transistors With Ultra High Mobilities," Appl. Phys. Lett. (Applied Physics Letters, Dec. 18, 2006, vol. 89, No. 25, pp. 252101-1-252101-3.

Lee.C et al., "High-Mobility Nanocrystalline Silicon Thin-Film Transistors Fabricated by Plasma-Enhanced Chemical Vapor Deposition," Appl. Phys. Lett. (Applied Physics Letters, May 24, 2005, vol. 86, pp. 222106-1-222106-3.

Lee.C et al., "High-Mobility N-Channel and P-Channel Nanocrystalline Silicon Thin-Film Transistors," IEDM 05: Technical Digest of International Electron Devices Meeting, 2005, pp. 937-940.

Lee.C et al., "How to Achieve High Mobility Thin Film Transistors by Direct Deposition of Silicon Using 13.56 MHZ RF PECVD?," IEDM, 2006, pp. 295-298.

Esmaeili-Rad.M et al., "High Stability, Low Leakage Nanocrystalline Silicon Bottom Gate Thin Film Transistors for Amoled Displays," IEEE IEDM, 2006, pp. 303-306.

Lee.H et al., "Leakage Current Mechanisms in Top-Gate Nanocrystalline Silicon Thin-Film Transistors," Appl. Phys. Lett. (Applied Physics Letters, Feb. 28, 2008, vol. 92, pp. 083509-1-083509-3.

Esmaeili-Rad.M et al., "Absence of Defect State Creation in Nanocrystalline Silicon Thin-Film Transistors Deduced From Constant Current Stress Measurements," Appl. Phys. Lett. (Applied Physics Letters, Sep. 12, 2007, vol. 91, pp. 113511-1-113511-3.

Lee.C et al., "Stability of NC-SI:H TFTS With Silicon Nitride Gate Dielectric," IEEE Transactions on Electron Devices, 2007, vol. 54, No. 1, pp. 45-51.

Sazonov.A et al., "Low-Temperature Materials and Thin Film Transistors for Flexible Electronics," Proceedings of the IEEE, Aug. 1, 2005, vol. 93, No. 8, pp. 1420-1428.

Esmaeili-Rad.M et al., "Stability of Nanocrystalline Silicon Bottom-Gate Thin-Film Transistors With Silicon Nitride Gate Dielectric," J. Appl. Phys. (Journal of Applied Physics, Sep. 28, 2007, vol. 102, No. 6, pp. 064512-1-064512-7.

Lee.C et al., "Top-Gate TFTS Using 13.56MHZ PECVD Microcrystalline Silicon," IEEE Electron Device Letters, Sep. 5, 2005, vol. 26, No. 9, pp. 637-639.

Arai.T et al., "41.2: Micro Silicon Technology for Active Matrix OLED Display", SID Digest 07:SID International Symposium Digest of Technical Papers, pp. 1370-1373.

\* cited by examiner

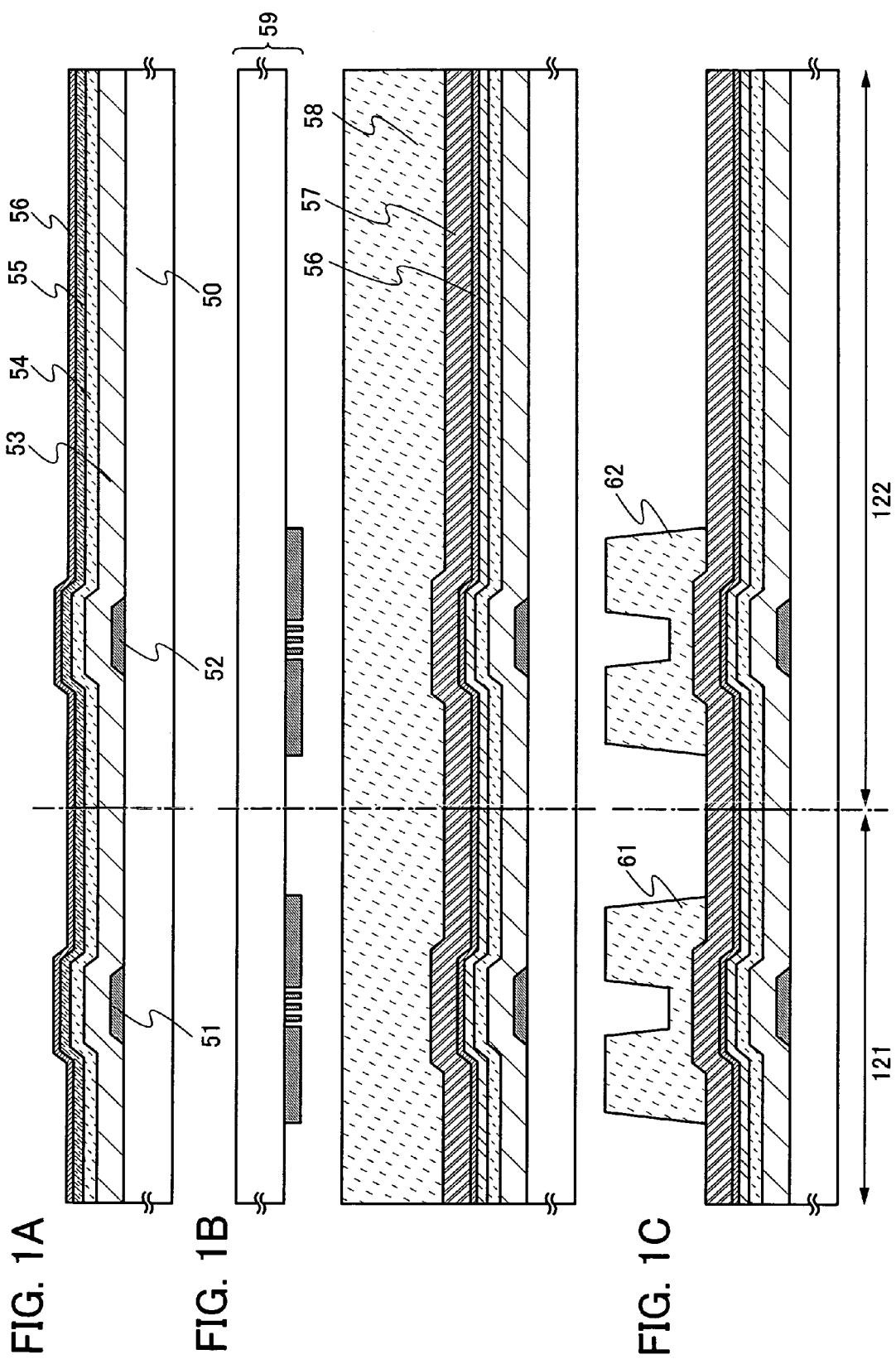

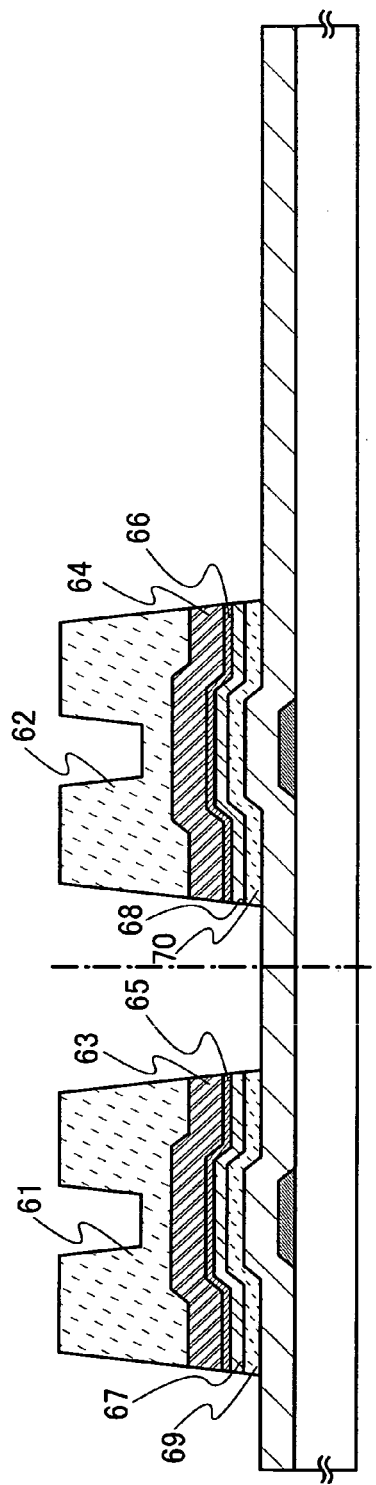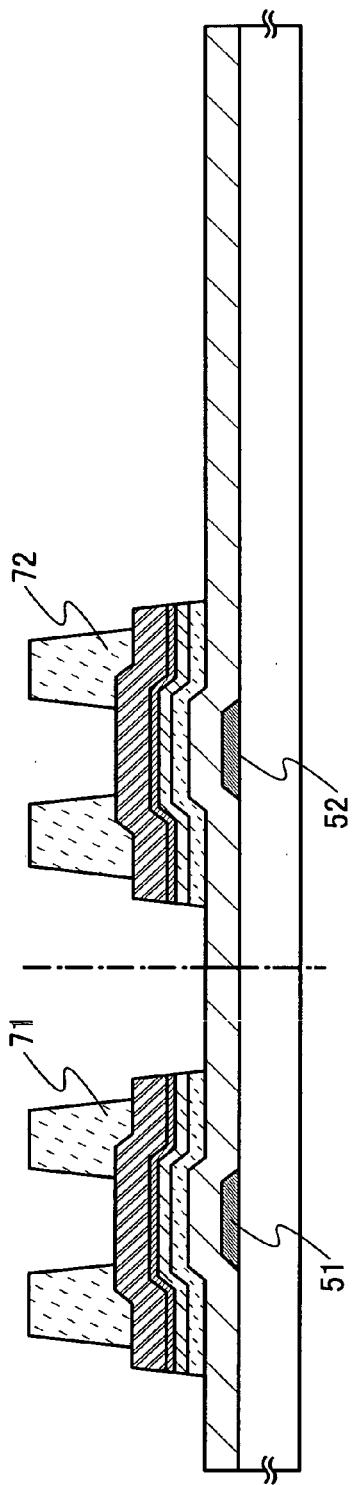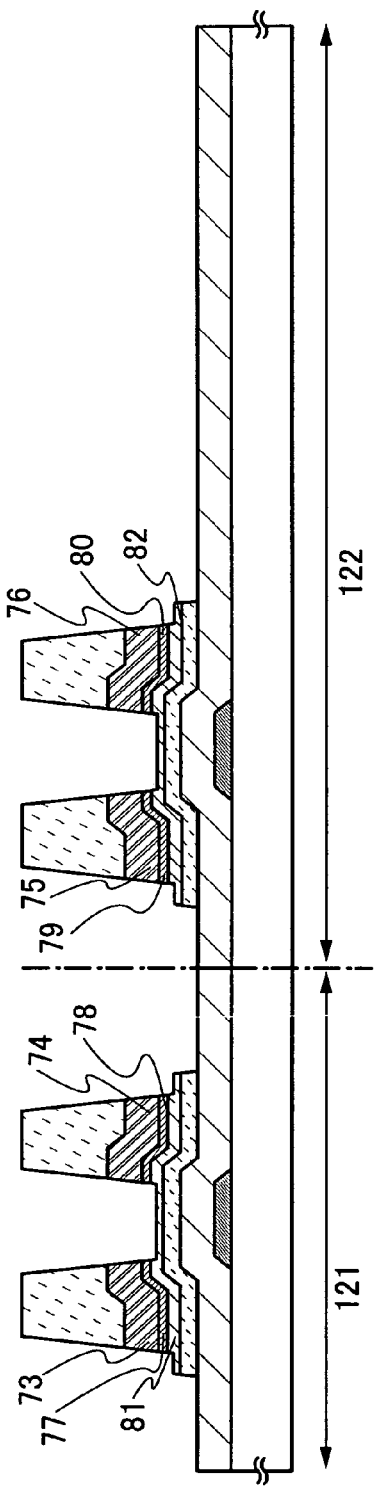

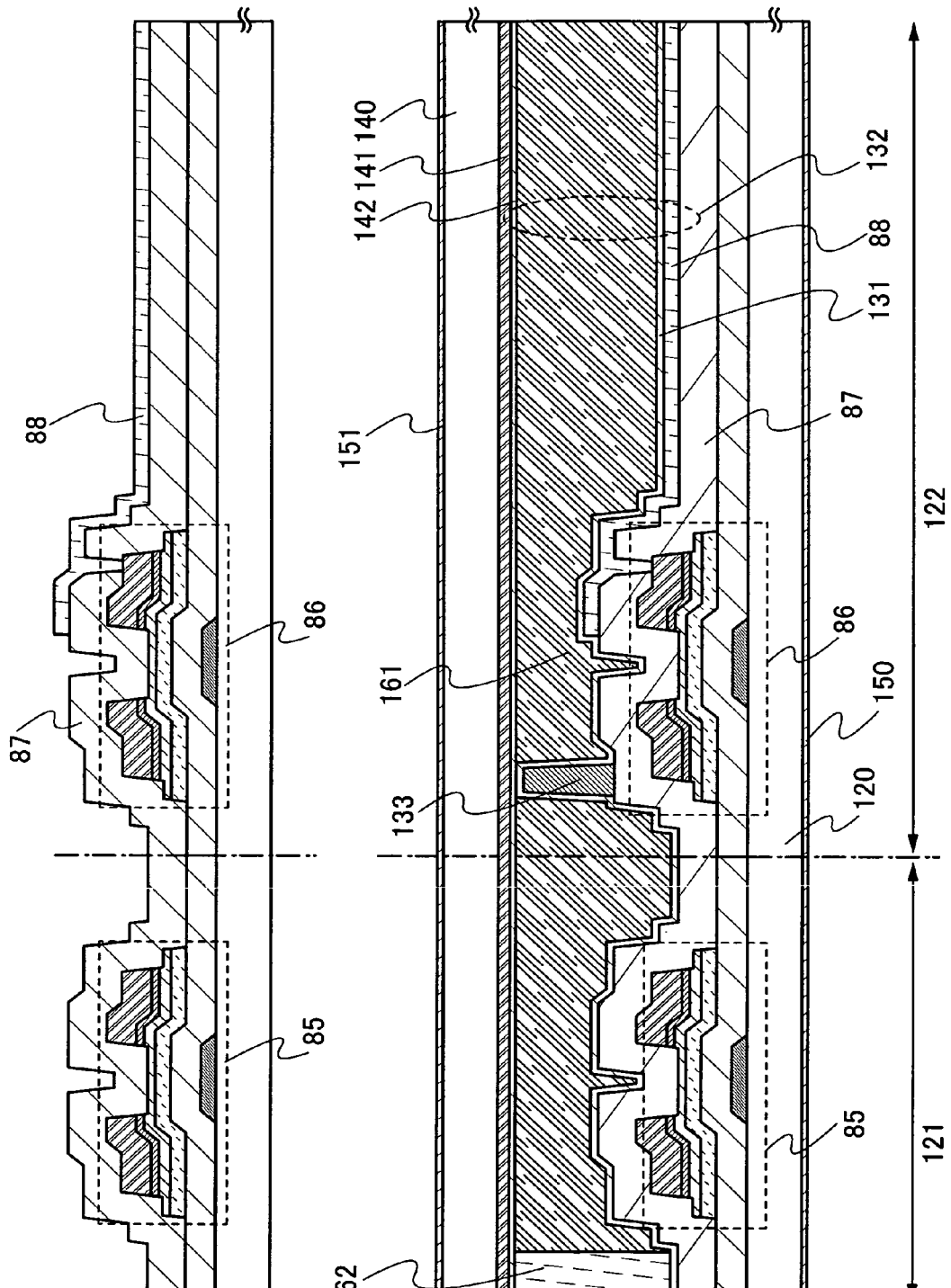

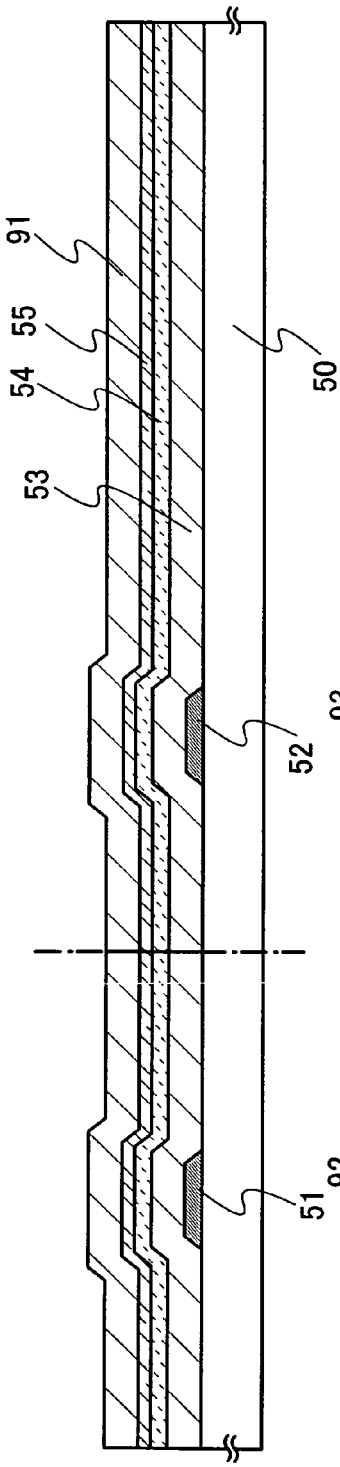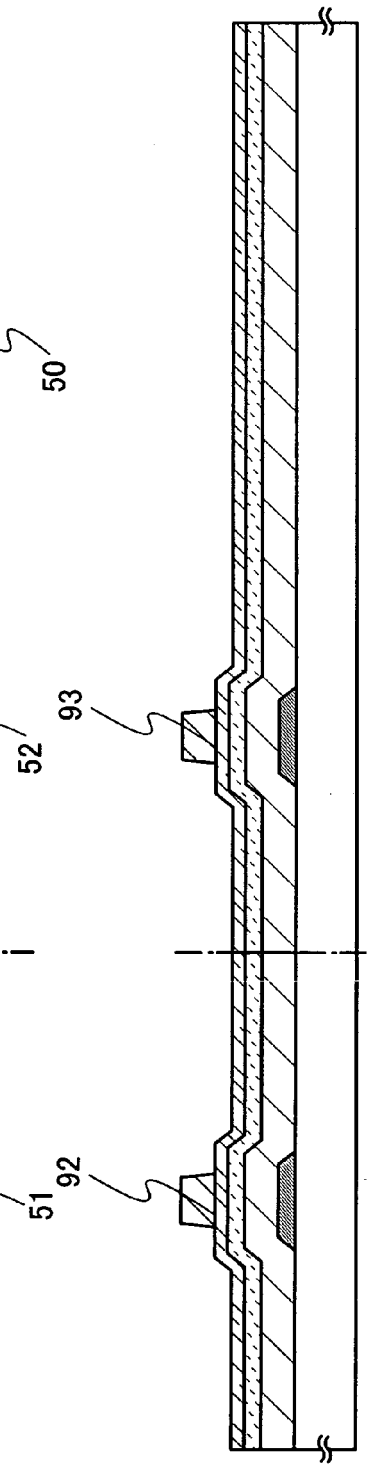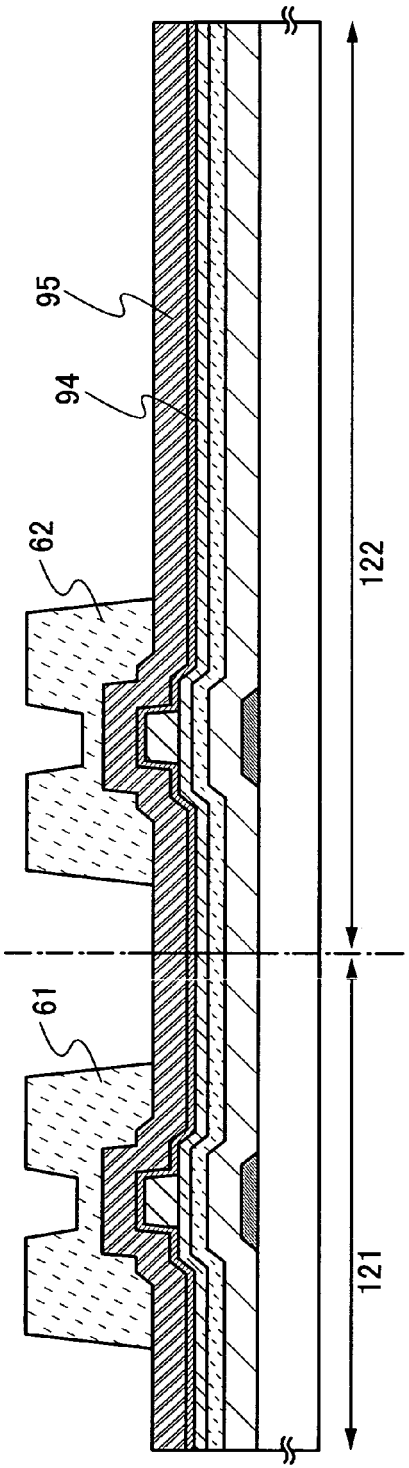

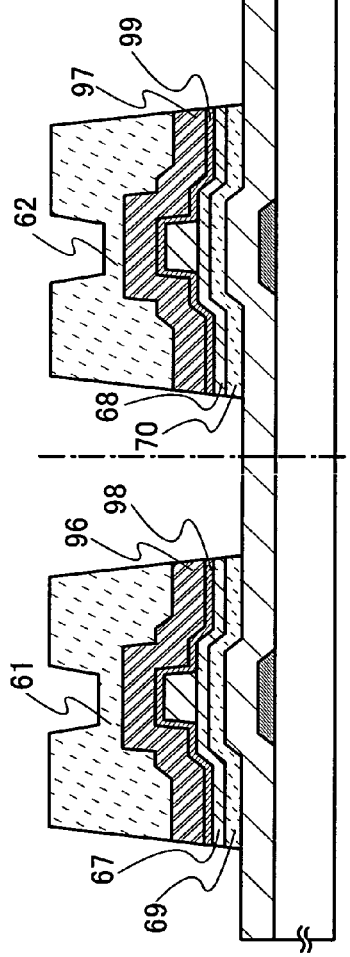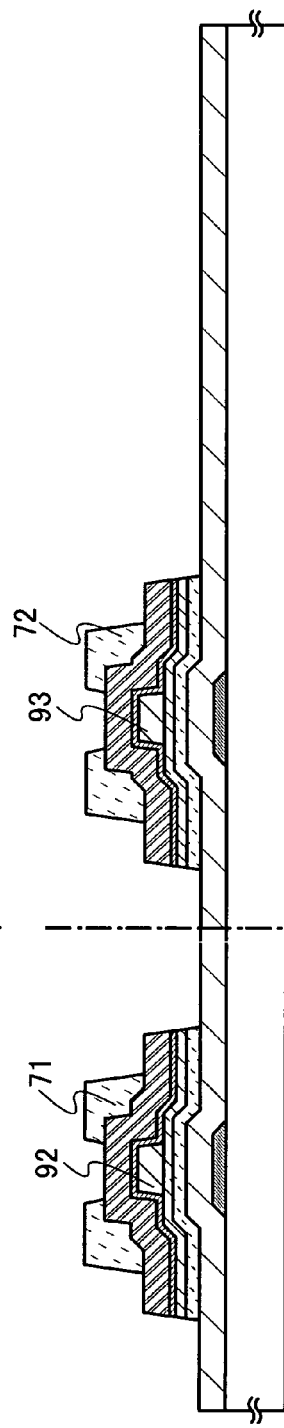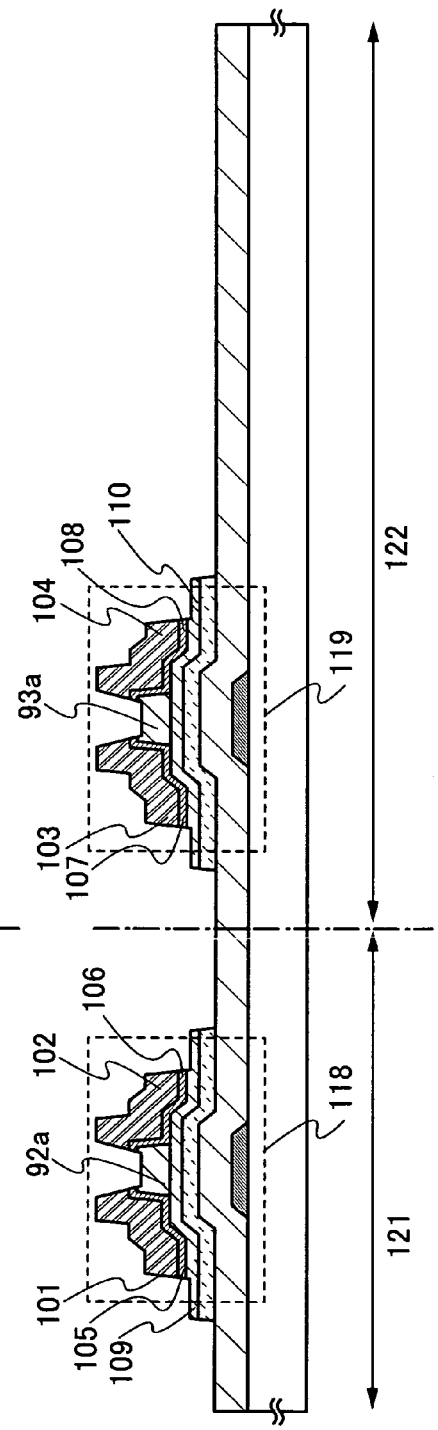
FIG. 5A
FIG. 5B
FIG. 5C

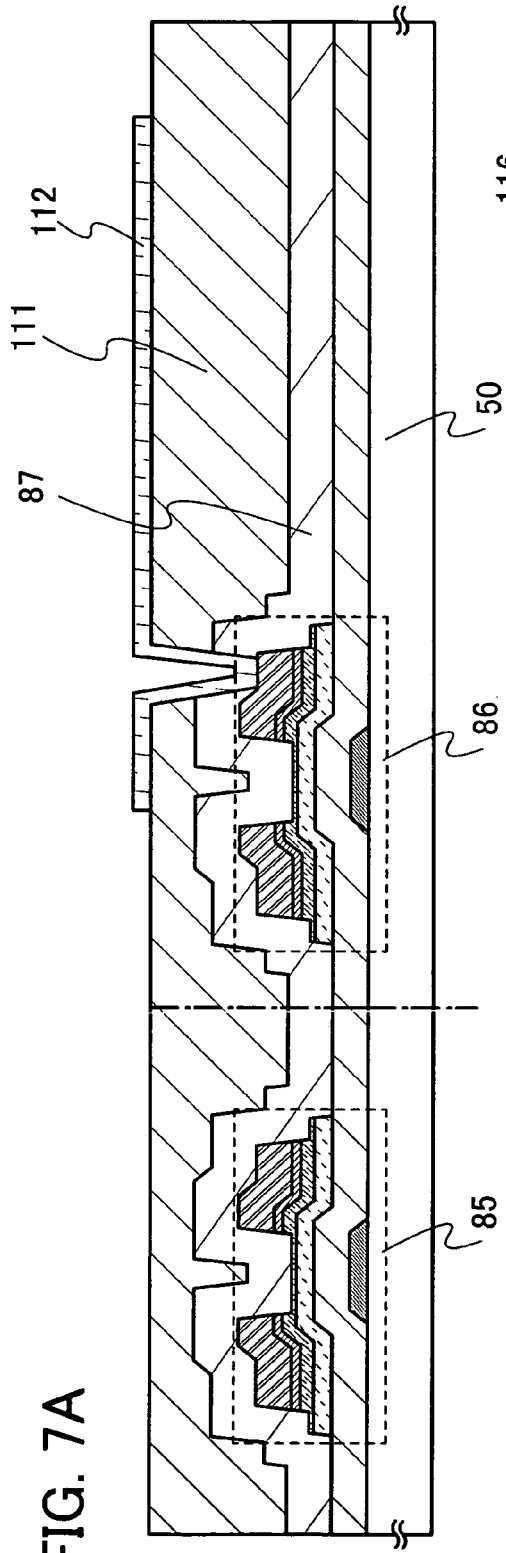
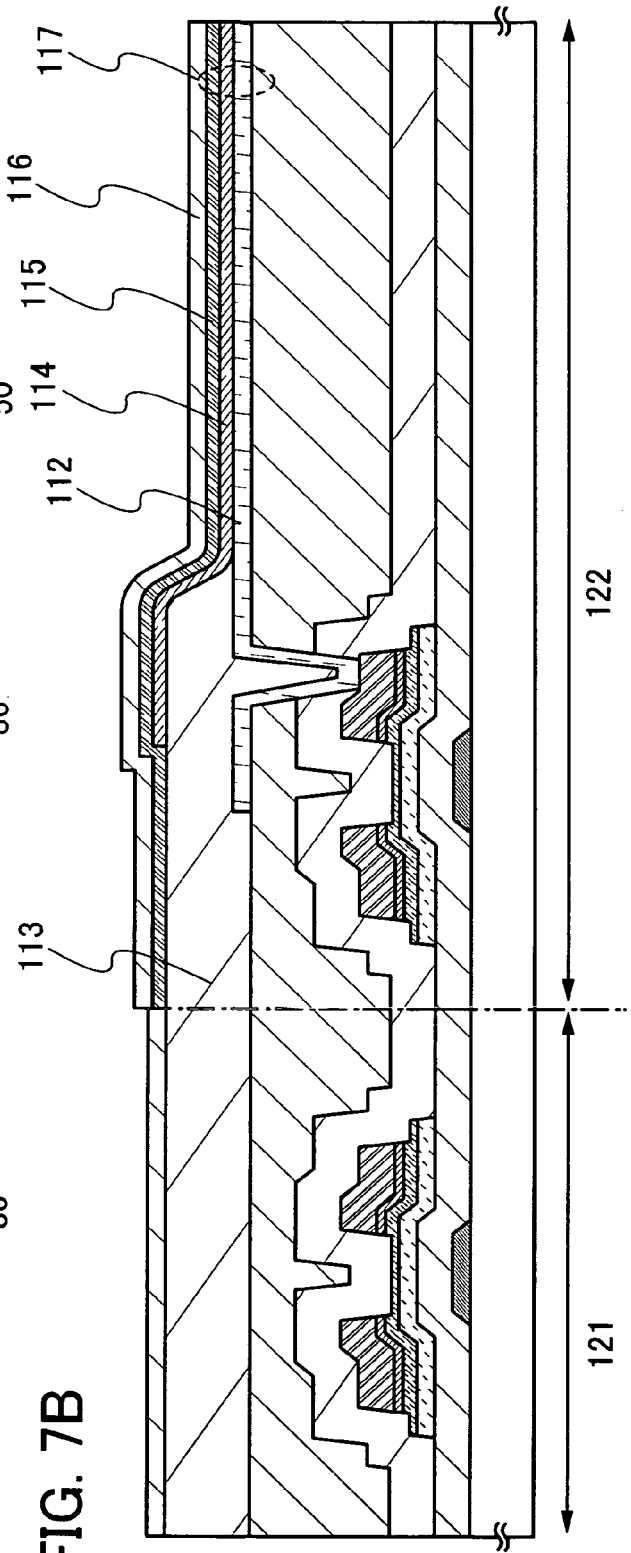
FIG. 7A
FIG. 7B

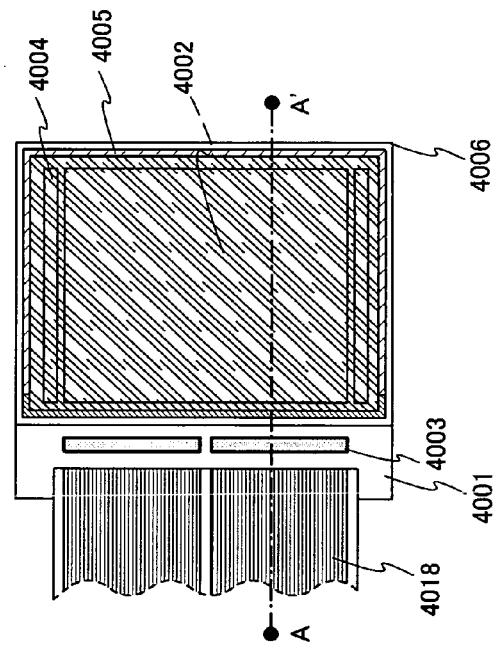
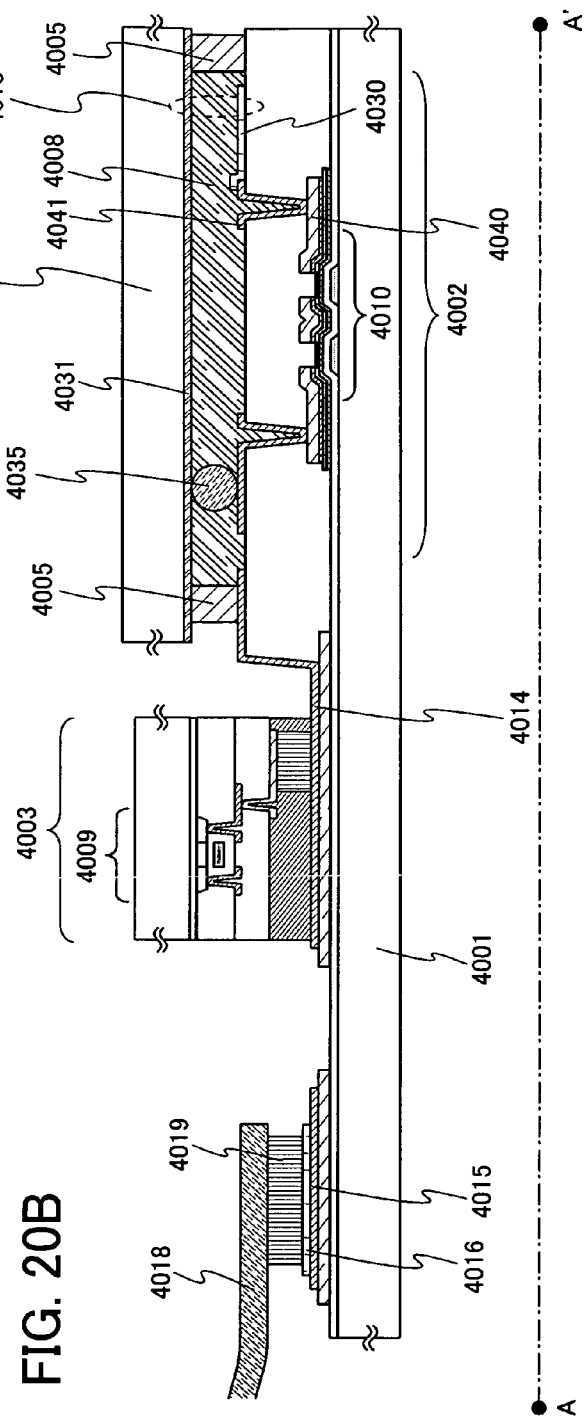
FIG. 20A
FIG. 20B

DISPLAY DEVICE COMPRISING AN ANTIOXIDANT FILM FORMED ON A MICROCRYSTALLINE SEMICONDUCTOR FILM WHEREIN THE ANTIOXIDANT FILM HAS A RECESSED PORTION OVERLAPPING A CHANNEL REGION

BACKGROUND OF THE INVENTION

1. Field of the Invention

The present invention relates to a display device in which a thin film transistor is used at least in a pixel portion.

2. Description of the Related Art

In recent years, technology that is used to form thin film transistors using semiconductor thin films (with thicknesses of from several tens of nanometers to several hundreds of nanometers, approximately) formed over substrates having an insulating surface, for channel formation regions, has been attracting attention. Thin film transistors are applied to a wide range of electronic devices such as ICs or electro-optical devices, and prompt development of thin film transistors that are to be used as switching elements in image display devices, in particular, is being pushed.

As a switching element in an image display device, a thin film transistor in which an amorphous semiconductor film is used for a channel formation region, a thin film transistor in which a polycrystalline semiconductor film is used for a channel formation region, or the like is used.

As a switching element in an image display device, further, a thin film transistor in which a microcrystalline semiconductor film is used for a channel formation region is used (see Reference 1: Japanese Published Patent Application No. H4-242724; and Reference 2: Japanese Published Patent Application No. 2005-49832).

SUMMARY OF THE INVENTION

A thin film transistor using a polycrystalline semiconductor film for a channel formation region has an advantage that mobility is higher than that of a thin film transistor using an amorphous semiconductor film for a channel formation region by two or more digits, and a pixel portion and a peripheral driver circuit of a semiconductor display device can be formed over the same substrate. However, the thin film transistor using a polycrystalline semiconductor film for a channel formation region requires a more complicated process than the thin film transistor using an amorphous semiconductor film for a channel formation region because of crystallization of the semiconductor film. Thus, there are problems such as a reduction in yield and an increase in cost.

Further, there is a problem in that a surface of a crystal grain of a semiconductor is easily oxidized. Therefore, if a crystal grain in a channel formation region is oxidized, an oxide film is formed at a surface of the crystal grain to hinder carrier travel, thereby degrading the characteristics of a thin film transistor.

In view of the above problems, it is an object of the present invention to provide a display device suitable for mass production without degrading the characteristics of a thin film transistor and a manufacturing method thereof.

A feature of the present invention is that an antioxidant film is formed at a surface of a microcrystalline semiconductor film in a display device including a thin film transistor in which the microcrystalline semiconductor film (also referred to as a semiamorphous semiconductor film), a gate insulating film in contact with the microcrystalline semiconductor film, and a gate electrode overlap with each other.

An example of an antioxidant film is an amorphous semiconductor film, preferably an amorphous semiconductor film including at least one of nitrogen, hydrogen, and halogen. An amorphous semiconductor film including any one of nitrogen, hydrogen, and halogen can reduce oxidation of a crystal grain included in a microcrystalline semiconductor film.

An antioxidant film can be formed by a plasma CVD method, a sputtering method, or the like. Further, an antioxidant film can be formed by forming an amorphous semiconductor film and then nitriding, hydrogenating, or halogenating a surface of the amorphous semiconductor film by nitrogen plasma treatment, hydrogen plasma treatment, or halogen plasma treatment to the surface of the amorphous semiconductor film.

A microcrystalline semiconductor film can be directly formed as a microcrystalline semiconductor film over a substrate, which is different from a polycrystalline semiconductor film. Specifically, the microcrystalline semiconductor film can be formed using silicon hydride or silicon halide as a source gas with use of a microwave plasma CVD apparatus with a frequency of 1 GHz or more. The microcrystalline semiconductor film can be formed by a plasma CVD method with a frequency of 1 to 20 MHz, typically a high frequency of 13.56 MHz; or a high frequency in a VHF band of higher than 20 MHz and lower than or equal to 120 MHz approximately, typically 27.12 MHz or 60 MHz. The microcrystalline semiconductor film formed by the above method also includes a microcrystalline semiconductor film which has crystal grains with a diameter of 0.5 to 20 nm in an amorphous semiconductor. Therefore, a crystallization process after formation of the semiconductor film is not necessary, which is different from a case of the polycrystalline semiconductor film; thus, the number of steps in manufacturing a thin film transistor can be reduced, and the yield of the display device can be improved, and the cost can be suppressed. In addition, silicon hydride, which is a source gas, can be easily dissociated because plasma generated by using microwaves with a frequency of 1 GHz or more has high electron density. Accordingly, compared to a case of using a microwave plasma CVD apparatus with a frequency of several tens of MHz to several hundreds of MHz, with use of a microwave plasma CVD apparatus with a frequency of 1 GHz or more, the microcrystalline semiconductor film can be easily formed, and a deposition rate can be increased, and mass productivity of the display device can be improved.

An aspect of the present invention is a method for manufacturing a display device: in a plasma CVD apparatus in which a first gas pipe including a nozzle for releasing a gas to a substrate side and a second gas pipe including a nozzle for releasing a gas to an opposite side to the substrate intersect with each other in a lattice pattern, silicon hydride and dinitrogen monoxide are supplied to the first gas pipe, and a rare gas is supplied to the second gas pipe, whereby forming a silicon oxynitride film; and a thin film transistor is formed with use of the silicon oxynitride film.

Oxygen may be supplied to the second gas pipe. Alternatively, hydrogen may be supplied to the second gas pipe.

Introduction of dinitrogen monoxide to a gas pipe for supplying a gas to a substrate side can facilitate generation of plasma, reduce the amount of argon that is introduced to a treatment container of the plasma CVD apparatus, reduce cost, increase the introduction amount of a source gas, and thus can raise the deposition rate.

In addition, a thin film transistor (TFT) is manufactured using the microcrystalline semiconductor film, and a display device is manufactured using the thin film transistor for a pixel portion, and further, for a driver circuit. The thin film transistor including a microcrystalline semiconductor film has a mobility of 2 to 10 cm$^2$/V·sec, which is 2 to 20 times higher than that of a thin film transistor including an amorphous semiconductor film. Therefore, part of the driver circuit or the entire driver circuit can be formed over the same substrate as that of the pixel portion, so that a system-on-panel can be manufactured.

Examples of the display device include a light-emitting device and a liquid crystal display device. The light-emitting device includes a light-emitting element, and the liquid crystal display device includes a liquid crystal element. Examples of a light-emitting element include, in its category, an element whose luminance is controlled with current or voltage, specifically, an inorganic electroluminescence (EL) element, an organic EL element, an electron source element (electron-emissive element) used for a field emission display (FED), and the like.

In addition, the display device includes a panel in which a display element is sealed, and a module in which an IC and the like including a controller are mounted on the panel. The present invention further relates to one mode of an element substrate before the display element is completed in a manufacturing process of the light-emitting device, and the element substrate is provided with a means for supplying current to the light-emitting element in each of a plurality of pixels. Specifically, the element substrate may be in a state of being provided with only a pixel electrode of the display element, a state after a conductive film to be a pixel electrode is formed and before the conductive film is etched to form the pixel electrode, or any other states.

A display device in this specification means an image display device, a light-emitting device, or a light source (including a lighting device). Further, the display device includes any of the following modules in its category: a module including a connector such as an flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

In the present invention, an antioxidant film is formed on a surface of a microcrystalline semiconductor film and thus oxidation of a surface of a microcrystal grain can be reduced, thereby preventing the mobility of a thin film transistor from decreasing.

With use of a microwave plasma CVD apparatus with a frequency of 1 GHz or more, a deposition rate of a microcrystalline semiconductor film can be increased, and mass productivity of a display device including a thin film transistor including the microcrystalline semiconductor film can be improved.

In addition, a crystallization process of a semiconductor film after formation of the semiconductor film can be omitted, so that a system-on-panel of the display device can be achieved without complicating a manufacturing process of the thin film transistor.

BRIEF DESCRIPTION OF DRAWINGS

In the accompanying drawings:

FIGS. 1A to 1C are cross-sectional views illustrating a method for manufacturing a display device;

FIGS. 2A to 2C are cross-sectional views illustrating a method for manufacturing a display device;

FIGS. 3A and 3B are cross-sectional views illustrating a method for manufacturing a display device;

FIGS. 4A to 4C are cross-sectional views illustrating a method for manufacturing a display device;

FIGS. 5A to 5C are cross-sectional views illustrating a method for manufacturing a display device;

FIGS. 7A and 7B are cross-sectional views illustrating a method for manufacturing a display device;

FIGS. 20A and 20B are a top view and a cross-sectional view, respectively, illustrating a liquid crystal display panel;

DETAILED DESCRIPTION OF THE INVENTION

Embodiment Modes

Figure 6:
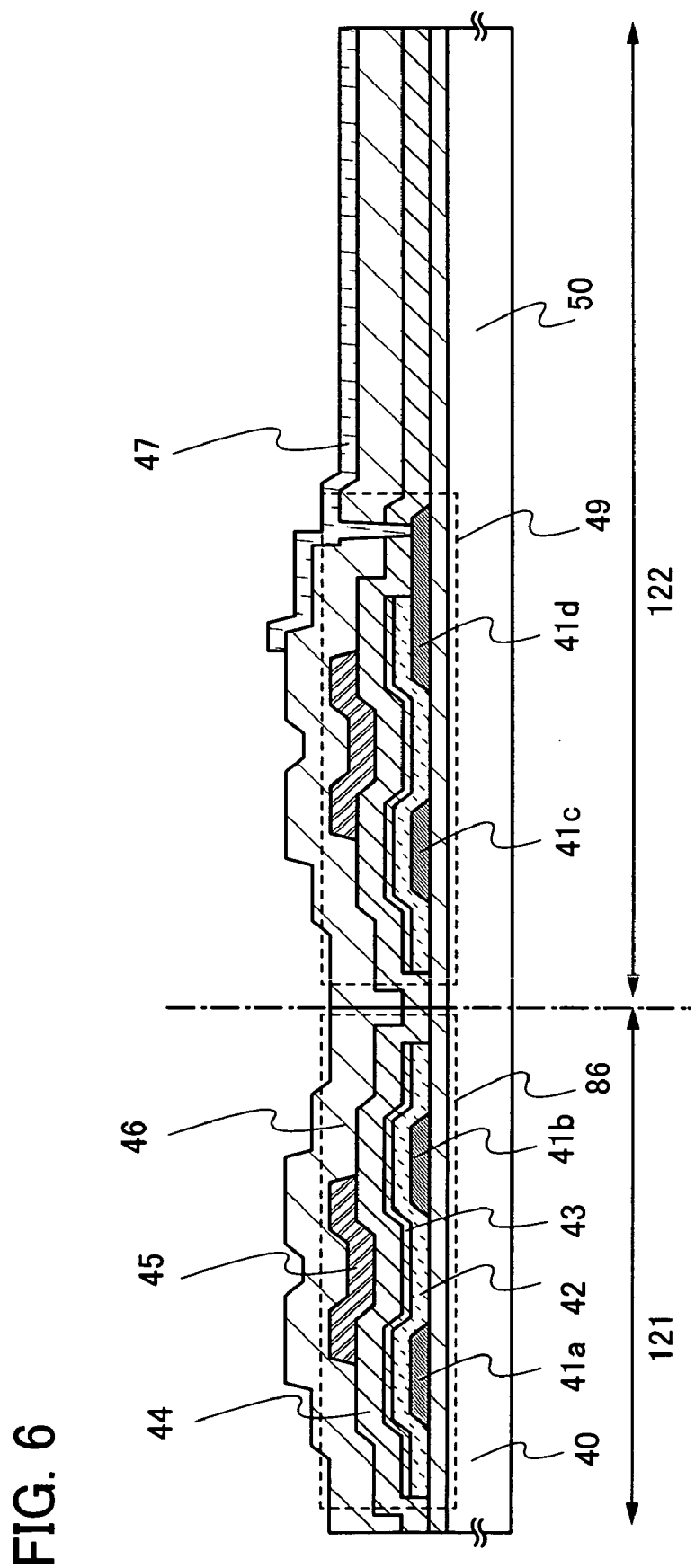
FIG. 6 is a cross-sectional view illustrating a method for manufacturing a display device.

Hereinafter, embodiment modes of the present invention are described with reference to the drawings. It is easily understood by those skilled in the art that the modes and details disclosed herein can be modified in various ways without departing from the spirit and scope of the present invention. Therefore, the present invention should not be interpreted as being limited to the description of the embodiment modes to be given below.

Embodiment Mode 1

A method for manufacturing a display device of the present invention is described. First, the description is made using a liquid crystal device, which is one mode of the display device. FIGS. 1A to 3B are cross-sectional views illustrating a thin film transistor used for a driver circuit and a thin film transistor used for a pixel portion. With regard to a thin film transistor including a microcrystalline semiconductor film, an n-channel thin film transistor has higher mobility than a p-channel thin film transistor; thus, an n-channel thin film transistor is more suitable for a driver circuit. However, in the present invention, either an n-channel or p-channel thin film transistor can be used. With any polarity of a thin film transistor, it is preferable that all the thin film transistors formed over one substrate have the same polarity so that the number of manufacturing steps is reduced.

As illustrated in FIG. 1A, gate electrodes 51 and 52 are formed over a substrate 50. As the substrate 50, a plastic substrate having sufficient heat resistance to withstand a processing temperature of a manufacturing process or the like as well as a non-alkaline glass substrate manufactured by a fusion method or a float method, such as a substrate of barium borosilicate glass, aluminoborosilicate glass, or aluminosilicate glass, or a ceramic substrate can be used. Alternatively, a metal substrate such as a stainless steel alloy substrate which is provided with an insulating film over the surface may also be used. As the substrate 50, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

The gate electrodes 51 and 52 are formed of a metal material such as titanium, molybdenum, chromium, tantalum, tungsten, or aluminum, or an alloy material thereof. The gate electrodes 51 and 52 can be formed as follows: a conductive film is formed over the substrate 50 by a sputtering method or a vacuum evaporation method; a mask is formed by a photolithography technique or an inkjet method over the conductive film; and the conductive film is etched using the mask. Alternatively, the gate electrodes 51 and 52 can be formed by discharging a conductive nanopaste of silver, gold, copper, or the like by an inkjet method and baking it. A nitride film formed of the above metal material may be provided between the substrate 50 and the gate electrodes 51 and 52 to improve adherence of the gate electrodes 51 and 52 to the substrate 50.

Since insulating films, semiconductor films, and wirings are formed over the gate electrodes 51 and 52, the gate electrodes 51 and 52 are preferably processed to have tapered end portions so that the insulating films, the semiconductor films, and the wirings thereover are not disconnected. Further, although not illustrated, wirings connected to the gate electrodes can also be formed at the same time when the gate electrodes are formed.

Next, a gate insulating film 53, a microcrystalline semiconductor film 54, an antioxidant film 55, and a semiconductor film 56 to which an impurity element imparting one conductivity type is added (hereinafter referred to as the semiconductor film 56) are formed in order over the gate electrodes 51 and 52. Preferably, at least the gate insulating film 53, the microcrystalline semiconductor film 54, and the antioxidant film 55 are formed successively. More preferably, the gate insulating film 53, the microcrystalline semiconductor film 54, the antioxidant film 55, and the semiconductor film 56 are formed successively. When at least the gate insulating film 53 and the microcrystalline semiconductor film 54 are formed successively without being exposed to the atmosphere, the films can be formed without any contamination of an interface between the films with atmospheric components or impurity elements contained in the atmosphere. Thus, variations in characteristics of thin film transistors can be reduced. Further, when the microcrystalline semiconductor film 54 and the antioxidant film 55 are formed successively without being exposed to the atmosphere, oxidation of a crystal grain of the microcrystalline semiconductor film can be prevented.

The gate insulating film 53 can be formed using a single layer or stacked layers of a silicon oxide film, a silicon nitride film, a silicon oxynitride film, and/or a silicon nitride oxide film by a CVD method, a sputtering method, or the like. Further, the gate insulating film 53 can be formed by stacking a silicon oxide film or a silicon oxynitride film, and a silicon nitride film or a silicon nitride oxide film in order from the substrate side. Furthermore, the gate insulating film 53 can be formed by stacking a silicon nitride film or a silicon nitride oxide film, a silicon oxide film or a silicon oxynitride film, and a silicon nitride film or a silicon nitride oxide film in order from the substrate side. Still furthermore, it is preferable to form the gate insulating film 53 with use of a microwave plasma CVD apparatus with a frequency of 1 GHz or more. A silicon oxynitride film or a silicon nitride oxide film formed with use of a microwave plasma CVD apparatus has high resistance to voltage, so that reliability of thin film transistors that are formed later can be improved.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The microcrystalline semiconductor film 54 is a film including a semiconductor having an intermediate structure between amorphous and crystalline (including single-crystalline and polycrystalline) structures. This semiconductor is in a third state, in which the semiconductor is stable in free energy, and is a crystalline semiconductor having short-range order and lattice distortion; and crystal grains thereof with a diameter of 0.5 nm to 20 nm can be dispersed in a non-single crystalline semiconductor. The semiconductor includes hydrogen or halogen by at least 1 at. % to terminate a dangling bond. Moreover, a rare gas element such as helium, argon, krypton, or neon may be included to further promote lattice distortion, so that the stability is enhanced and a favorable microcrystalline semiconductor film can be obtained. Such description about a microcrystalline semiconductor film is disclosed in, for example, U.S. Pat. No. 4,409,134.

The microcrystalline semiconductor film 54 can be formed with use of a microwave plasma CVD apparatus with a frequency of 1 GHz or more. Typically, the microcrystalline semiconductor film 54 can be formed using silicon hydride such as $SiH_4$ or $Si_2H_6$, or silicon halide such as $SiH_2Cl_2$, $SiHCl_3$, $SiCl_4$, or $SiF_4$. Alternatively, silicon hydride or silicon halide may be diluted with hydrogen; one or more rare gas elements such as helium, argon, krypton, and neon; or hydrogen and one or more rare gas elements such as helium, argon, krypton, and neon, to form the microcrystalline semiconductor film.

The microcrystalline semiconductor film 54 is formed with a thickness of 1 to 300 nm inclusive, preferably 5 to 200 nm inclusive.

In addition, a carbide gas such as $CH_4$ or $C_2Hr$, or a germanide gas such as $GeH_4$ or $GeF_4$ may be mixed into silicon hydride or silicon halide to adjust the width of an energy band to be 1.5 to 2.4 eV, or 0.9 to 1.1 eV.

The microcrystalline semiconductor film has low n-type conductivity when an impurity element for controlling valence electrons is not added thereto intentionally. Therefore, an impurity element imparting p-type conductivity may be added to the microcrystalline semiconductor film which functions as a channel formation region of a thin film transistor at the same time as or after formation of the microcrystalline semiconductor film, so that the threshold voltage can be controlled. A typical example of the impurity element imparting p-type conductivity is boron, and an impurity gas such as $B_2H_6$ or $BF_3$ may be mixed into silicon hydride or silicon halide at a concentration of 1 to 1000 ppm, preferably 1 to 100 ppm. A concentration of boron is preferably set to be $1 \times 10^{14}$ to $6 \times 10^{16}$ atoms/cm$^3$.

In the microcrystalline semiconductor film, it is preferable that an oxygen concentration be $5 \times 10^{18}$ atoms/cm$^3$ or less or $1 \times 10^{18}$ atoms/cm$^3$ or less, and that a nitrogen concentration and a carbon concentration each be $1 \times 10^{19}$ atoms/cm$^3$ or less. Reducing concentrations of oxygen, nitrogen, and carbon in the microcrystalline semiconductor film can prevent the microcrystalline semiconductor film from assuming an n-type.

Further, before forming the microcrystalline semiconductor film, a surface of the gate insulating film may undergo treatment with plasma of hydrogen, nitrogen, halogen, or a rare gas to make the surface uneven. Accordingly, lattice distortion at an interface between the gate insulating film and the microcrystalline semiconductor film can be reduced.

The antioxidant film 55 can be formed by a plasma CVD method using silicon hydride such as $SiH_4$ or $Si_2H_6$, or silicon halide such as $SiH_2Cl_2$, $SiHCl_3$, $SiCl_4$, or $SiF_4$. Further, as the antioxidant film 55, an amorphous semiconductor film can also be formed using the above silicon hydride or silicon halide that is diluted with any one or plural elements of helium, argon, krypton, or neon. Furthermore, an amorphous semiconductor film including hydrogen can also be formed using the above silicon hydride or silicon halide, and hydrogen. Still furthermore, an amorphous semiconductor film including nitrogen can also be formed using the silicon hydride or silicon halide, and nitrogen or ammonia. Still furthermore, an amorphous semiconductor film including fluorine, chlorine, bromine, or iodine can also be formed using the above silicon hydride, and a gas including fluorine, chlorine, bromine, or iodine (e.g., $F_2$, $Cl_2$, $Br_2$, $I_2$, HF, HCl, HBr, or HI).

Further, as the antioxidant film 55, an amorphous semiconductor film can be formed by sputtering an amorphous semiconductor, which is a target, with hydrogen or a rare gas. At this time, if ammonia, nitrogen, or $N_2O$ is included in the atmosphere, an amorphous semiconductor film including nitrogen can be formed. If a gas including fluorine, chlorine, bromine, or iodine (e.g., $F_2$, $Cl_2$, $Br_2$, $I_2$, HF, HCl, HBr, or HI) is included in the atmosphere, an amorphous semiconductor film including fluorine, chlorine, bromine, or iodine can be formed.

Furthermore, as the antioxidant film 55, an amorphous semiconductor film may be formed on a surface of the microcrystalline semiconductor film 54 by a plasma CVD method or a sputtering method, and then the amorphous semiconductor film may undergo hydrogen plasma treatment, nitrogen plasma treatment, or halogen plasma treatment, to be hydrogenated, nitrided, or halogenated.

It is preferable to form the antioxidant film 55 using an amorphous semiconductor film which does not include a crystal grain. Therefore, if the antioxidant film 55 is formed by a high-frequency plasma CVD method with a frequency of several tens of MHz to several hundreds of MHz, or a microwave plasma CVD method, it is preferable to control the film deposition conditions so that the antioxidant film 55 may be an amorphous semiconductor film that does not include a crystal grain.

In a process of forming a source region and a drain region later, the antioxidant film 55 can be etched partly. In such a case, it is preferable to form the antioxidant film 55 with such a thickness that part of the antioxidant film 55 can remain. Typically, the antioxidant film 55 is formed with a thickness of 1 to 100 nm inclusive, preferably 1 to 50 nm inclusive, more preferably 1 to 10 nm inclusive.

Formation of the amorphous semiconductor film or the amorphous semiconductor film including hydrogen, nitrogen, or halogen on a surface of the microcrystalline semiconductor film 54 can prevent a surface of a crystal grain included in the microcrystalline semiconductor film 54 from being oxidized naturally. In particular, a region where an amorphous semiconductor and the crystal grain are in contact with each other is easily cracked because of distortion of a crystal lattice. If a crack is exposed to oxygen, the crystal grain is oxidized to form silicon oxide. However, formation of the antioxidant film on the surface of the microcrystalline semiconductor film 54 can prevent the crystal grain from being oxidized.

If an n-channel thin film transistor is formed, the semiconductor film 56 may be doped with phosphorus, which is a typical impurity element; for example, an impurity gas such as $PH_3$ may be added to silicon hydride or silicon halide. If a p-channel thin film transistor is formed, the semiconductor film 56 may be doped with boron, which is a typical impurity element; for example, an impurity gas such as $B_2H_6$ may be added to silicon hydride or silicon halide. The semiconductor film 56 can be formed using a microcrystalline semiconductor or an amorphous semiconductor.

Figure 10:
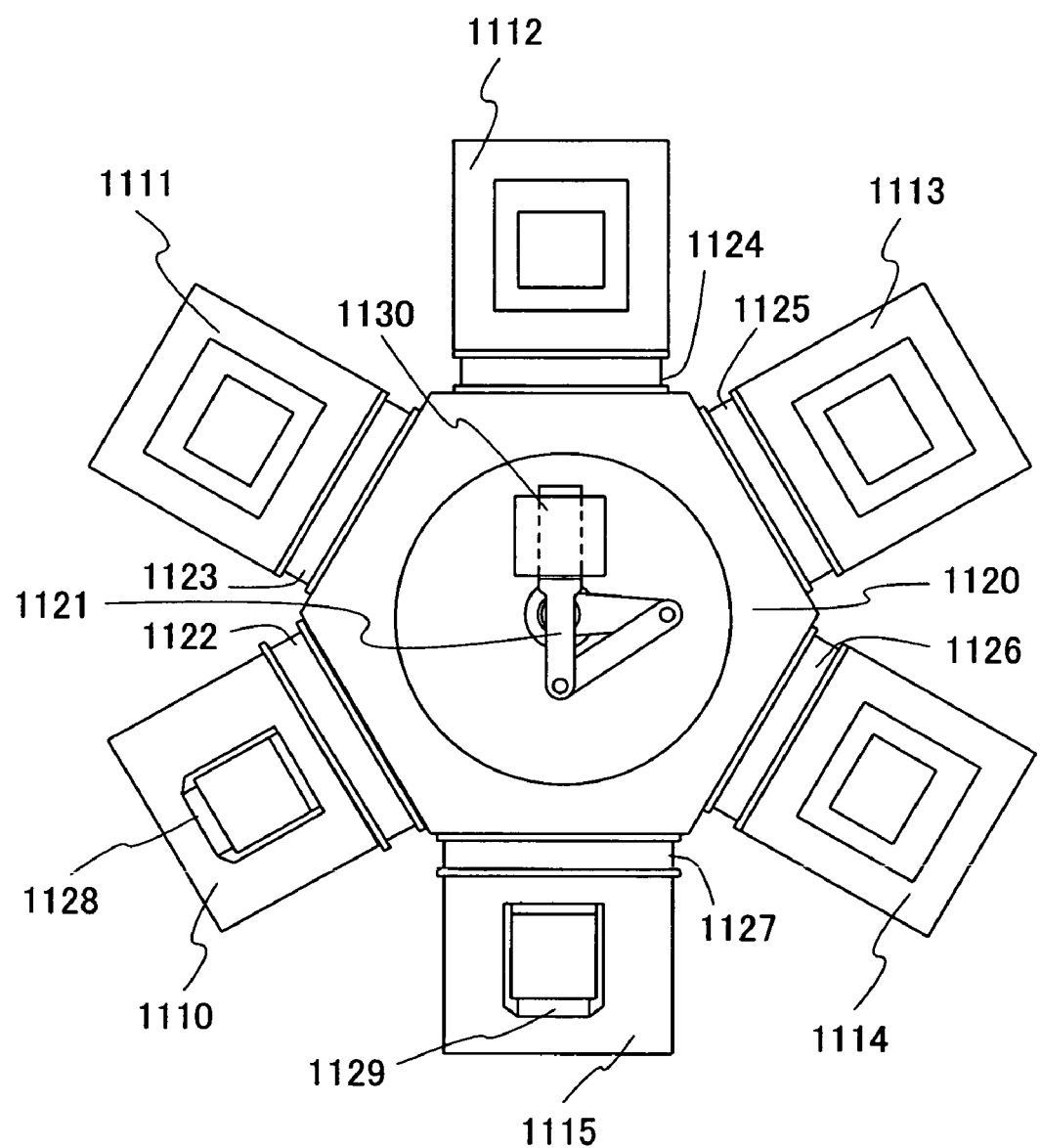
FIG. 10 is a top view illustrating a microwave plasma CVD apparatus.

FIG. 10 illustrates a microwave plasma CVD apparatus by which the films from the gate insulating film 53 to the semiconductor film 56 can be formed successively. FIG. 10 schematically shows a top view of the microwave plasma CVD apparatus. A common chamber 1120 is provided around with a load chamber 1110, an unload chamber 1115, and reaction chambers (1) 1111 to (4) 1114. Gate valves 1122 to 1127 are provided between the common chamber 1120 and each reaction chamber so that treatment in each reaction chamber does not have influence on treatment in other chambers. Substrates 1130 are set in a cassette 1128 of the load chamber 1110 and a cassette 1129 of the unload chamber 1115, respectively, and transferred to the reaction chambers (1) 1111 to (4) 1114 by a transfer unit 1121 of the common chamber 1120. This apparatus can allocate the films to be stacked to their respective reaction chambers according to the kind of the film, and a plurality of different films can be formed successively without being exposed to the atmosphere.

In each of the reaction chambers (1) to (4), the gate insulating film 53, the microcrystalline semiconductor film 54, the antioxidant film 55, and the semiconductor film 56 are stacked. In this case, the plurality of different kinds of films can be stacked successively by changing source gases. Alternatively, the gate insulating film 53, the microcrystalline semiconductor film 54, and the antioxidant film 55 are stacked successively in each of the reaction chambers (1) and (3), and the semiconductor film 56 is formed in each of the reaction chambers (2) and (4). When only the semiconductor film 56, to which an impurity element imparting one conductivity type is added, is formed separately from other films in this manner, the impurity element imparting one conductivity type which remains in the chamber can be prevented from being mixed into other films.

In this manner, with use of the microwave plasma CVD apparatus in which the plurality of chambers are connected, the gate insulating film 53, the microcrystalline semiconductor film 54, the antioxidant film 55, and the semiconductor film 56 can be formed at the same time, so that the mass productivity can be enhanced. Further, also when some reaction chamber is being subjected to maintenance or cleaning, the films can be formed in other reaction chambers, and the films can be formed efficiently. In addition, an interface between the films can be formed without being contaminated with atmospheric components or impurity elements contained in the atmosphere; thus, variations in characteristics of the thin film transistors can be reduced.

Further, if the gate insulating film is formed with a two-layer structure including a silicon oxide film or a silicon oxynitride film, and a silicon nitride film or a silicon nitride oxide film, five reaction chambers may be provided; the silicon oxide film or the silicon oxynitride film in the gate insulating film may be formed in the reaction chamber (1); the silicon nitride film or the silicon nitride oxide film in the gate insulating film may be formed in the reaction chamber (2); the microcrystalline semiconductor film may be formed in the reaction chamber (3); the antioxidant film may be formed in the reaction chamber (4); and the semiconductor film to which an impurity element imparting one conductivity type is added may be formed in the reaction chamber (5). At this time, the inner wall of each reaction chamber is preferably coated with a film corresponding to the film to be formed. With use of the microwave plasma CVD apparatus having such a structure, one kind of film can be formed in its respective reaction chamber, and the films can be formed successively without being exposed to the atmosphere. Thus, an interface between the films can be formed without being contaminated with a residue of another film which has already been formed or impurity elements contained in the atmosphere.

Further, a microwave generation unit and a high frequency wave generation unit may be provided; thus, the gate insulating film, the microcrystalline semiconductor film, and the semiconductor film to which an impurity element imparting one conductivity type is added may be formed by a microwave plasma CVD method, and the antioxidant film may be formed by a high frequency plasma CVD method.

Although the microwave plasma CVD apparatus in FIG. 10 is provided with the load chamber and the unload chamber separately, a load chamber and an unload chamber may be combined and a load/unload chamber may be provided. In addition, the microwave plasma CVD apparatus may be provided with a spare chamber. By pre-heating the substrate in the spare chamber, it is possible to shorten heating time before formation of the film in each reaction chamber, so that the throughput can be improved.

Figure 11A:
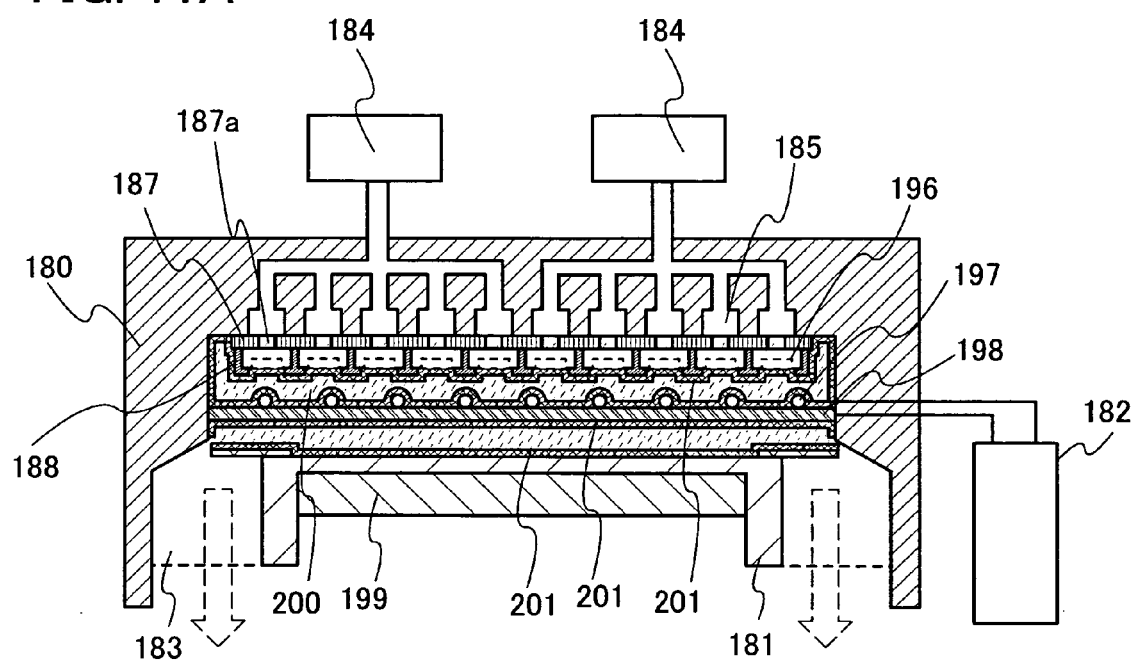
FIGS. 11A and 11B are cross-sectional views of a reaction chamber of a microwave plasma CVD apparatus.
Figure 11B:
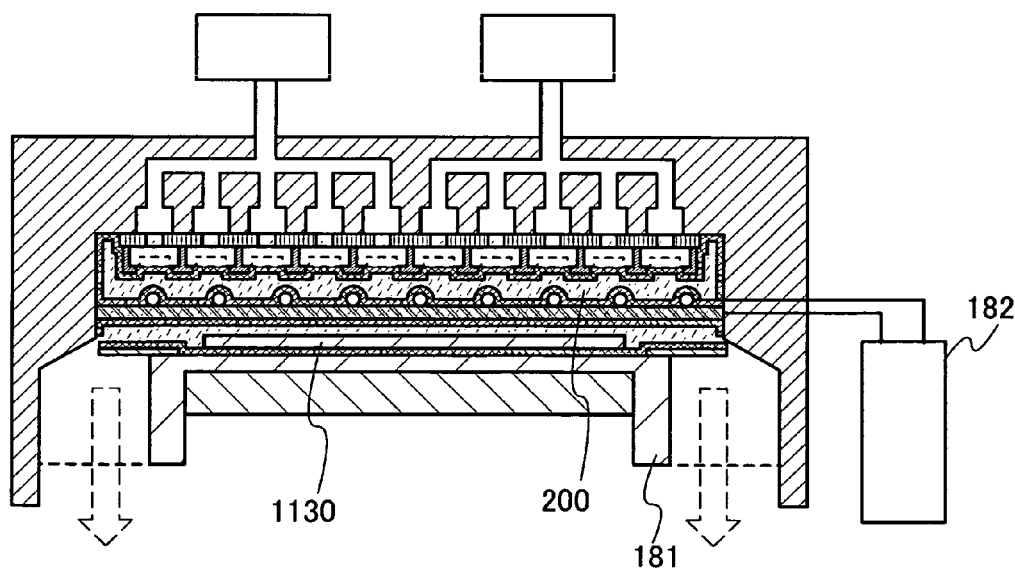

FIGS. 11A and 11B illustrate a detailed structure of one reaction chamber of such a microwave plasma CVD apparatus. A gas supply unit 182 and microwave generation units 184 are provided outside the reaction chamber.

The microwave generation units 184 supply microwaves with a frequency of 1 GHz or more, preferably 2.45 GHz or more, more preferably 8.3 GHz or more. In the present invention, stable large-area plasma can be generated by provision of the plurality of microwave generation units 184. Therefore, a highly uniform film can be formed over a large-sized substrate with one side of over 600 mm, particularly over 1000 mm, and a deposition rate can be increased.

A treatment container 180 has an airtight structure, and thus can keep reduced pressure inside. The treatment container 180 and a top plate 187 are formed of a metal whose surface is covered with an insulating film such as alumina, silicon oxide, or a fluorine resin; for example, an alloy including aluminum. In addition, fixing members 188 are formed of a metal such as an alloy including aluminum.

In order to reduce the pressure in the reaction chamber, a vacuum pump is connected to the treatment container 180 through an exhaust port 183. The vacuum pump has a low evacuation unit and a high evacuation unit. The low evacuation unit makes a gating valve operate and evacuates the reaction chamber from atmospheric air to about 0.1 Pa. The low evacuation unit is constituted of a dry pump, for example. The high evacuation unit performs high evacuation to 0.1 Pa or lower, and is constituted of a turbo-molecular pump or the like. A pressure-adjustment valve that is connected in series to the high evacuation unit adjusts conductance of a gas flow, and keeps the pressure in the reaction chamber in a predetermined range by adjusting the exhaust velocity of a reaction gas supplied from the gas supply unit 182.

A support 181 for placing the substrate 1130 is provided in the treatment container 180. The support 181 is formed of a ceramic material such as aluminum nitride, silicon nitride, or silicon carbide. A temperature controller 199 is provided on an inner side of the support 181, whereby the temperature of the substrate 1130 can be controlled. In addition, the support 181 may be provided with a power feeding portion that is connected to a high-frequency power supply. By providing the power feeding portion, a bias voltage can be applied to the substrate that is placed on the support 181.

Waveguides 185 connected to the microwave generation units 184 are provided above the treatment container 180. The waveguides 185 introduce microwaves generated in the microwave generation units 184 to the treatment container 180. Further, the top plate 187 that is in contact with the waveguides 185 and has opening portions 187a is provided, and a plurality of dielectric plates 196 are provided for the top plate 187 with use of the fixing members 188.

The dielectric plates 196 are provided so as to be in close contact with the opening portions of the top plate 187. The microwaves generated in the microwave generation units 184 are propagated to the dielectric plates 196 by passing through the waveguides 185 and the opening portions 187a of the top plate 187, and transmitted through the dielectric plates 196 to be released into the treatment container. By field effect energy of the microwaves released into the treatment container, a gas introduced from the gas supply unit 182 is made into a plasma state. This plasma 200 has higher density on the surface of the dielectric plates 196; thus, damage to the substrate 1130 can be reduced. Provision of the plurality of dielectric plates 196 can generate and keep uniform large-area plasma. The dielectric plate 196 is formed of ceramics such as sapphire, quartz glass, alumina, silicon oxide, or silicon nitride. The dielectric plate 196 may have a recessed portion on the side where the plasma 200 is generated. By the recessed portion, stable plasma can be generated. By provision of the plurality of dielectric plates 196, a highly uniform film can be formed over a large-sized substrate with one side of over 600 mm, particularly over 1000 mm, and a deposition rate can be increased.

A gas pipe 197 with a nozzle for releasing a gas to the dielectric plates 196 side and a gas pipe 198 with a nozzle for releasing a gas to the substrate 1130 side are provided to intersect with each other in a lattice pattern. The gas pipe 198 releases a source gas, whereby the source gas can be released to a position closer to the substrate 1130, and thus a deposition rate can be increased. The gas pipes 197 and 198 are formed of ceramics such as alumina or aluminum nitride. Transmissivity of the microwaves is high in the ceramics; therefore, when the gas pipes 197 and 198 are formed of ceramics, distribution of the plasma can be uniform without disturbing an electric field, even if the gas pipe is provided right under the dielectric plates 196.

Figure 12:
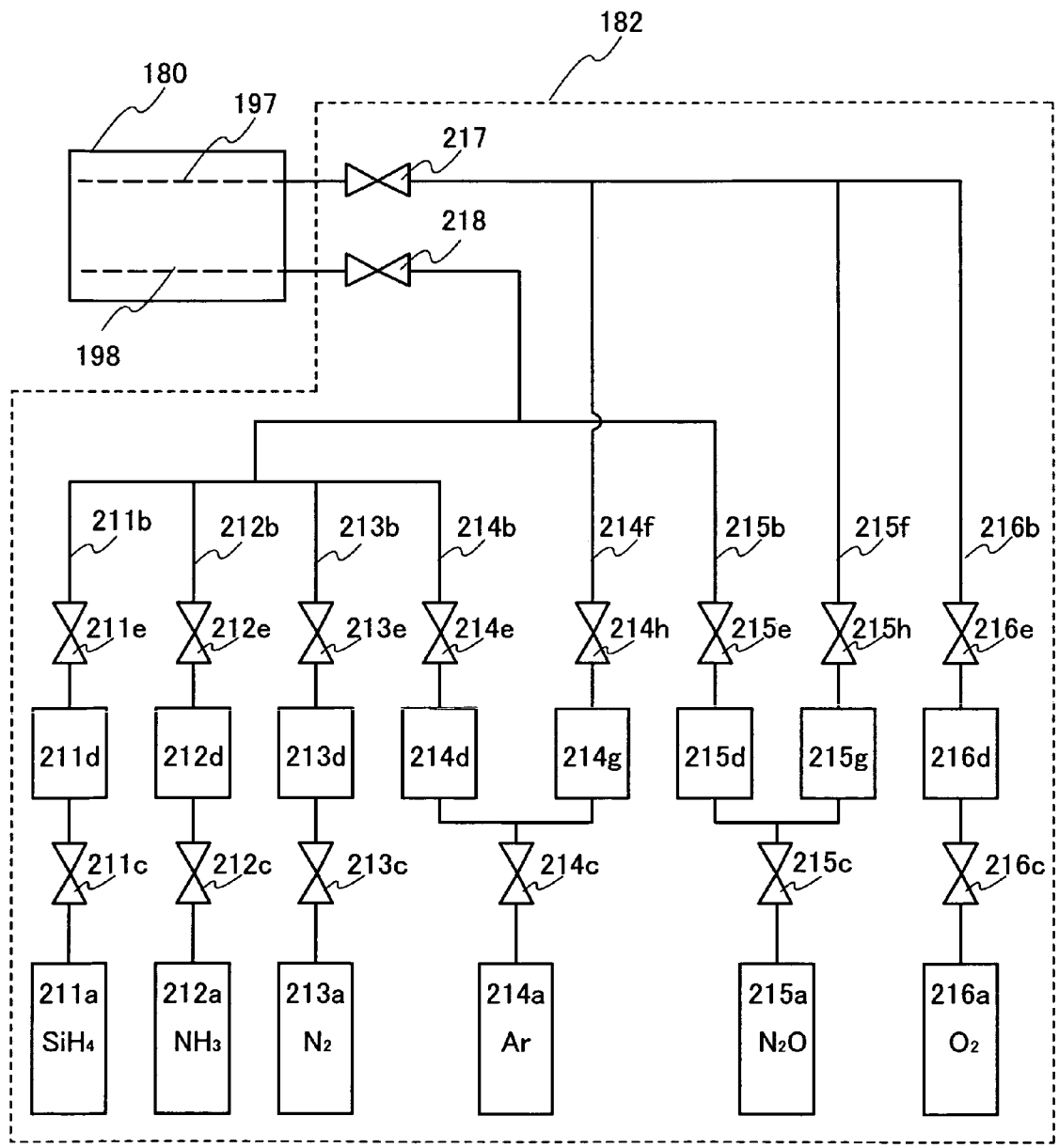
FIG. 12 is a diagram illustrating a gas supply unit of a microwave plasma CVD apparatus.

Now the gas supply unit 182, which supplies a gas to the inside of the treatment container 180, is described in detail with reference to FIG. 12.

The treatment container 180 includes the gas pipe 197 that supplies a gas to the dielectric plates 196 side and the gas pipe 198 that supplies a gas to the substrate 1130 side; in this manner, gases which are supplied in their respective directions are separated.

The gas pipe 198 that supplies a gas to the substrate 1130 side is connected to a gas line 211$b$ for silicon hydride such as silane, a gas line 212$b$ for ammonia, a gas line 213$b$ for nitrogen, a gas line 214$b$ for argon, and a gas line 215$b$ for dinitrogen monoxide through a last valve 218 of the gas pipe 198.

The gas line 211$b$ for silicon hydride is provided with a silicon hydride supply source 211$a$, a valve 211$c$, a mass flow controller 211$d$, and a valve 211$e$. When the valves 211$c$ and 211$e$ are opened, a silicon hydride gas whose flow rate is controlled by the mass flow controller 211$d$ is introduced to the last valve 218. On opening the last valve 218, the silicon hydride gas is supplied to the gas pipe 198.

The gas line 212$b$ for ammonia is provided with an ammonia supply source 212$a$, a valve 212$c$, a mass flow controller 212$d$, and a valve 212$e$. When the valves 212$c$ and 212$e$ are opened, an ammonia gas whose flow rate is controlled by the mass flow controller 212$d$ is introduced to the last valve 218. On opening the last valve 218, the ammonia gas is supplied to the gas pipe 198.

The gas line 213$b$ for nitrogen is provided with a nitrogen supply source 213$a$, a valve 213$c$, a mass flow controller 213$d$, and a valve 213$e$. When the valves 213$c$ and 213$e$ are opened, a nitrogen gas whose flow rate is controlled by the mass flow controller 213$d$ is introduced to the last valve 218. On opening the last valve 218, the nitrogen gas is supplied to the gas pipe 198.

The gas line 214$b$ for argon is provided with an argon supply source 214$a$, a valve 214$c$, a mass flow controller 214$d$, and a valve 214$e$. When the valves 214$c$ and 214$e$ are opened, an argon gas whose flow rate is controlled by the mass flow controller 214$d$ is introduced to the last valve 218. On opening the last valve 218, the argon gas is supplied to the gas pipe 198.

The gas line 215$b$ for dinitrogen monoxide is provided with a dinitrogen monoxide supply source 215$a$, a valve 215$c$, a mass flow controller 215$d$, and a valve 215$e$. When the valves 215$c$ and 215$e$ are opened, a dinitrogen monoxide gas whose flow rate is controlled by the mass flow controller 215$d$ is introduced to the last valve 218. On opening the last valve 218, the dinitrogen monoxide gas is supplied to the gas pipe 198.

The gas pipe 197 that supplies a gas to the dielectric plates 196 side is connected to a gas line 214$f$ for argon, a gas line 215$f$ for dinitrogen monoxide, and a gas line 216$b$ for oxide through the last valve 217 of the gas pipe 197.

The gas line 214$f$ for argon is provided with the argon supply source 214$a$, a valve 214$c$, a mass flow controller 214$g$, and a valve 214$h$. When the valves 214$c$ and 214$h$ are opened, an argon gas whose flow rate is controlled by the mass flow controller 214$g$ is introduced to the last valve 217. On opening the last valve 217, the argon gas is supplied to the gas pipe 197.

The gas line 215$f$ for dinitrogen monoxide is provided with the dinitrogen monoxide supply source 215$a$, a valve 215$c$, a mass flow controller 215$g$, and a valve 215$h$. When the valves 215$c$ and 215$h$ are opened, a dinitrogen monoxide gas whose flow rate is controlled by the mass flow controller 215$g$ is introduced to the last valve 217. On opening the last valve 217, the dinitrogen monoxide gas is supplied to the gas pipe 197.

The gas line 216$b$ for oxide is provided with an oxygen supply source 216$a$, a valve 216$c$, a mass flow controller 216$d$, and a valve 216$e$. When the valves 216$c$ and 216$e$ are opened, an oxygen gas whose flow rate is controlled by the mass flow controller 216$d$ is introduced to the last valve 217. On opening the last valve 217, the oxygen gas is supplied to the gas pipe 197.

The argon supply source 214$a$ branches into the gas line 214$b$ for argon and the gas line 214$f$ for argon, thereby supplies the argon gas to the gas pipe 198 and the gas pipe 197. Further, the dinitrogen monoxide supply source 215$a$ branches into the gas line 215$b$ for dinitrogen monoxide and the gas line 215$f$ for dinitrogen monoxide gas, thereby supplies the dinitrogen monoxide gas to the gas pipe 198 and the gas pipe 197.

With introduction of a source gas such as silicon hydride, ammonia, nitrogen, or dinitrogen monoxide to the gas pipe 198 that supplies a gas to the substrate side, a deposition rate can be increased. With introduction of dinitrogen monoxide to the gas pipe 198 that supplies a gas to the substrate side, plasma can be generated easily. In a case where dinitrogen monoxide is introduced to the dielectric plate side, a large amount of argon needs to be introduced into the treatment container in order to facilitate generation of plasma. With introduction of dinitrogen monoxide to the substrate side, however, the amount of argon which is introduced into the treatment container can be reduced and thus cost can be reduced; and the introduction amount of a source gas can be increased and thus the deposition rate can be increased.

The following describes a process for forming a film. For this process, a gas supplied from the gas supply unit 182 may be determined in accordance with a desired film.

Here, a method for forming a silicon oxynitride film and a silicon nitride oxide film as a gate insulating film is given as an example.

First, the inside of the reaction chamber of the microwave plasma CVD apparatus is cleaned with fluorine radicals. The fluorine radicals are obtained by introducing carbon fluoride, nitrogen fluoride, or fluorine into a plasma generator provided outside the reaction chamber and dissociating the substance. By introducing the fluorine radicals into the reaction chamber, the reaction chamber can be cleaned.

After cleaning with the fluorine radicals, a large amount of hydrogen is introduced into the reaction chamber, whereby the hydrogen and a fluorine residue in the reaction chamber react with each other to reduce the concentration of the fluorine residue. Thus, the amount of fluorine which enters a protective film which is formed later on an interior wall of the reaction chamber can be reduced, and the thickness of the protective film can be reduced.

Next, as shown in FIG. 11A, a silicon oxynitride film is deposited as a protective film 201 on surfaces of an inner wall of the treatment container 180 of the reaction chamber, the dielectric plates 196, the gas pipes 197 and 198, the support 181, and the like. Here, a pressure in the treatment container 180 is set to be 1 to 200 Pa, preferably 10 to 40 Pa, and one or more rare gases such as helium, argon, xenon, or krypton is introduced as a gas for generating plasma to the treatment container 180. Alternatively, hydrogen and a rare gas are introduced. In particular, it is preferable to use helium, or helium and hydrogen as a gas for generating plasma.

Although helium has as high ionization energy as 24.5 eV, a metastable state lies in 20 eV approximately; thus, helium can be ionized at 4 eV approximately during electric discharge. Thus, helium starts to discharge electrically at a low voltage, and the state of electric discharge can be kept with ease. Accordingly, plasma can be kept uniform and lower power consumption can be achieved.

As a gas for generating plasma, one or more kinds of rare gases such as helium, argon, xenon, or krypton, and an oxygen gas may also be introduced. When an oxygen gas as well as a rare gas is introduced into the treatment container 180, plasma can be generated easily.

Here, the microwave generation units 184 are turned on, and the plasma 200 is generated in such a condition that an output of the microwave generation units 184 is 500 to 6000 W, preferably 4000 to 6000 W. Then, a source gas is introduced from the gas pipe 198 into the treatment container 180. Specifically, dinitrogen monoxide, a rare gas, and silane are introduced as a source gas, whereby the silicon oxynitride film is formed as the protective film 201 on the surfaces of the inner wall of the treatment container 180, the gas pipes 197 and 198, the dielectric plates 196, and the support 181. At this time, a flow rate of silicon hydride is 50 to 300 sccm, a flow rate of dinitrogen monoxide is 500 to 6000 sccm, and a thickness of the protective film 201 is 500 to 2000 nm.

Next, supply of the source gas is halted, and the pressure in the treatment container 180 is reduced. After that, the microwave generation units 184 are turned off. Then, as shown in FIG. 11B, the substrate 1130 is placed over the support 181 in the treatment container 180.

Next, a silicon oxynitride film is deposited over the substrate by a similar process to that of the protective film.

After the silicon oxynitride film with a given thickness is deposited, supply of a source gas is halted, and the pressure in the treatment container 180 is reduced, and the microwave generation units 184 are turned off.

Next, the pressure in the treatment container 180 is set to be 1 to 200 Pa, preferably 1 to 100 Pa. One or more rare gases such as helium, argon, xenon, or krypton, which is a gas for generating plasma, and silane, dinitrogen monoxide, and ammonia, which are source gases, are introduced into the treatment container 180. Nitrogen may be introduced as a source gas instead of ammonia. Next, the microwave generation units 184 are turned on, and the plasma 200 is generated in such a condition that an output of the microwave generation units 184 is 500 to 6000 W, preferably 4000 to 6000 W. Subsequently, the source gases are introduced into the treatment container 180 from the gas pipe 198, whereby a silicon nitride oxide film is formed over the silicon oxynitride film that is provided over the substrate 1130. After that, supply of the source gases is halted, and the pressure in the treatment container 180 is reduced, and the microwave generation units 184 are turned off, so that the film formation process is completed.

Through the above steps, the silicon oxynitride film is formed as the protective film on the inner wall of the reaction chamber, and the silicon oxynitride film and the silicon nitride oxide film are formed successively over the substrate, thereby curbing intrusion of impurities such as silicon oxide into the silicon nitride oxide film, which is an upper layer of the gate insulating film. Since the silicon nitride oxide film has high resistance to voltage, variation in threshold voltage of a transistor can be reduced when the film is used as the gate insulating film. In addition, a BT (bias-temperature) characteristic can be improved. Further, resistance to static electricity is increased, so that a transistor that is hardly broken even when a high voltage is applied thereto can be manufactured. Furthermore, a transistor that is hardly broken over time can be manufactured. Still furthermore, a transistor that is hardly damaged by hot carriers can be manufactured.

In a case where a single layer of a silicon oxynitride film is formed as the gate insulating film, the above method for forming the protective film and the above method for forming the silicon oxynitride film are used. In particular, when a flow rate of dinitrogen monoxide is 100 to 300 times inclusive, preferably 150 to 250 times inclusive as high as that of silane, a silicon oxynitride film with high resistance to voltage can be formed.

Now a method for forming a microcrystalline semiconductor film by a microwave plasma CVD method is described. First, the reaction chamber is cleaned in a similar manner to the case of the gate insulating film. Then, a silicon film is deposited as a protective film in the treatment container 180. Here, a pressure in the treatment container is set to be 1 to 200 Pa, preferably 1 to 100 Pa, and one or more rare gases such as helium, argon, xenon, or krypton is introduced as a gas for generating plasma. Alternatively, hydrogen and the rare gas may be introduced into the treatment container 180.

Next, the microwave generation units 184 are turned on, and the plasma 200 is generated in such a condition that an output of the microwave generation units 184 is set to be 500 to 6000 W, preferably 4000 to 6000 W. After that, a source gas is introduced into the treatment container 180 from the gas pipe 198. Specifically, a silicon compound gas and further a hydrogen gas are introduced as source gases, so that a microcrystalline silicon film is formed as a protective film 201 on surfaces of the inner wall of the treatment container 180, the gas pipes 197 and 198, the dielectric plate 196, and the support 181. A thickness of the protective film at this time is 500 to 2000 nm.

Next, supply of the source gas is halted, and the pressure in the treatment container 180 is reduced, and the microwave generation units 184 are turned off. After that, the substrate 1130 is placed over the support 181 in the treatment container 180 as shown in FIG. 11B.

Next, a microcrystalline silicon film is deposited over the substrate by a similar process to the case of the protective film.

After the microcrystalline silicon is deposited with a given thickness, supply of a source gas is halted, and the pressure in the treatment container 180 is reduced, and the microwave generation units 184 are turned off, so that the film formation process is completed.

Plasma generated by the microwave plasma CVD apparatus with a frequency of 1 GHz or more has high electron density and forms a lot of radicals from the source gas, and the radicals are supplied to the substrate 1130. Thus, reaction of radicals on the surface of the substrate is promoted and a deposition rate of the microcrystalline silicon can be increased. Further, the microwave plasma CVD apparatus provided with the plurality of microwave generation units and the plurality of dielectric plates can generate stable large-area plasma. Therefore, a film whose quality is highly uniform can be formed over a large-sized substrate, and mass productivity can be increased.

In each process for manufacturing the gate insulating film and the semiconductor film, the cleaning treatment and the treatment for forming the protective film can be omitted if a protective film with a thickness of 500 to 2000 nm is formed on the inner wall of the reaction chamber.

If the gate insulating film and the microcrystalline semiconductor film are stacked in one reaction chamber, the gate insulating film is formed and then silicon hydride such as silane is introduced into the reaction chamber, whereby an oxygen residue and the silicon hydride react with each other; and then a reactant is discharged to an outside of the reaction chamber; thus, the concentration of the oxygen residue in the reaction chamber can be reduced. As a result, the concentration of oxygen in the microcrystalline semiconductor film can be reduced. Further, a crystal grain in the microcrystalline semiconductor film can be prevented from being oxidized.

The microwave plasma CVD apparatus may be provided with a helium low temperature purifier, which purifies a helium gas. Specifically, a helium low temperature purifier is provided between the exhaust port 183 and the gas supply unit 182, which are shown in FIGS. 11A and 11B. Now a method for purifying and reusing a helium gas which is introduced into the treatment chamber is described with reference to FIG. 13.

Figure 13:
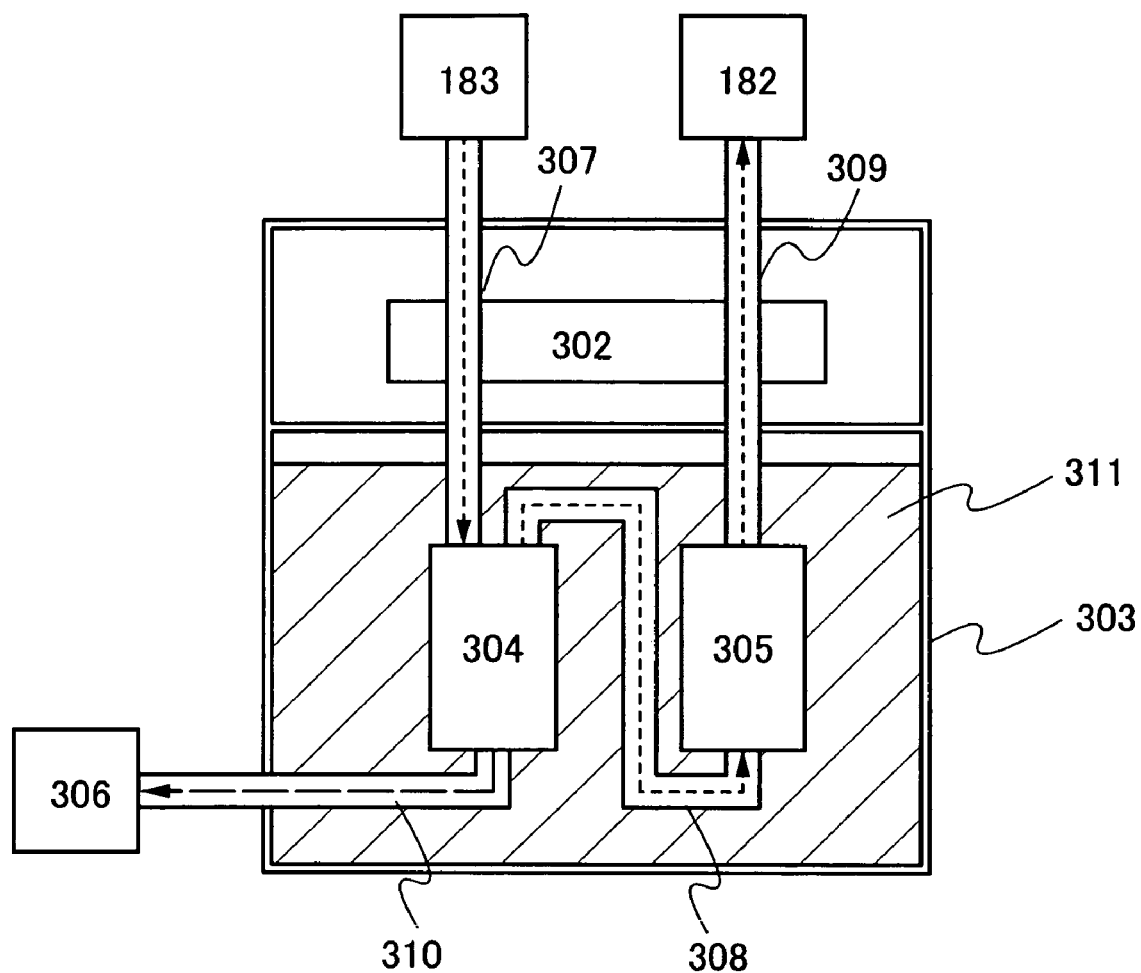
FIG. 13 is diagram illustrating a gas purifier of a microwave plasma CVD apparatus.

FIG. 13 schematically illustrates a helium low temperature purifier, which removes an impurity from helium.

The helium low temperature purifier includes a liquefied nitrogen storage tank 303 including a gas-liquid separator 304, which liquefies an impurity in a helium gas, and an adsorber 305, which separates off an impurity in a gas which has been separated in the gas-liquid separator 304.

The liquefied nitrogen storage tank 303 is filled, for example, with liquefied nitrogen 311 in order that a temperature is kept at which the helium gas is not liquefied and the impurity in the helium gas is liquefied. Further, at least the gas-liquid separator 304 is immersed therein. When the helium gas including the impurity is cooled to an appropriate temperature, e.g., 80 K, an impurity component with a low boiling point in the helium gas is liquefied. The liquefied impurity component can be separated off to an exhaust portion 306 through an exhaust pipe 310.

Further, the helium low temperature purifier includes a pipe 307 for introducing a helium including an impurity to the gas-liquid separator 304, a pipe 308 for introducing a helium gas from the gas-liquid separator 304 to the adsorber 305, a pipe 309 for supplying a purified helium gas from the adsorber 305 to the gas supply unit 182, and the exhaust pipe 310 for exhausting an impurity liquid which has been separated off in the gas-liquid separator 304 to the exhaust portion 306. Furthermore, the helium low temperature purifier may be provided with a heat exchanger 302 that cools a helium gas which is introduced to the pipe 307 and includes an impurity by heat exchange with a purified helium gas.

The helium gas which is exhausted through the exhaust port 183 of the treatment container and includes an impurity is introduced into the gas-liquid separator 304 through the pipe 307. In this process, the helium gas including an impurity is cooled by the heat exchanger 302. Next, in the gas-liquid separator 304 in the liquefied nitrogen storage tank 303, a liquefied impurity is separated off of the helium gas to the exhaust portion 306 through the exhaust pipe 310.

A slight amount of impurity unliquefied can remain in the helium gas in the gas-liquid separator 304. In order to remove this impurity, the helium gas is sent to the adsorber 305 through the pipe 308, and the slight amount of impurity is removed from the helium gas. As a result, a purified helium gas is introduced to the gas supply unit 182 through the heat exchanger 302. Thus, a helium gas can be separated off of an exhaust gas and purified, whereby the helium gas can be reused.

As described above, provision of a helium low temperature purifier between the exhaust port 183 and the gas supply unit 182 in a microwave plasma CVD apparatus enables expensive helium to be reused, and thus cost can be reduced.

Next, a conductive film 57 is formed over the semiconductor film 56, and a resist 58 is applied over the conductive film 57.

The conductive film 57 is preferably formed using aluminum; copper; or an aluminum alloy to which an element which prevents hillocks or an element to improve heat-resistance property, such as silicon, titanium, neodymium, scandium, or molybdenum, is added. Alternatively, a film in contact with the semiconductor film to which an impurity element imparting one conductivity type is added may be formed of titanium, tantalum, molybdenum, or tungsten, or nitride of such an element, and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or nitride thereof to form a stacked-layer structure.

The conductive film 57 is formed over the semiconductor film 56 by a sputtering method or a vacuum evaporation method. The conductive film 57 may also be formed by discharging a conductive nanopaste of silver, gold, copper, or the like by a screen printing method, an inkjet method, or the like and baking it.

The resist 58 can be positive or negative. In this embodiment mode, a positive resist is used.

Next, the resist 58 is irradiated with light using a multi-tone photomask 59 to expose the resist 58 to light.

Now light exposure using the multi-tone photomask 59 is described with reference to FIGS. 8A to 9B.

A multi-tone photomask allows the number of photomasks to be reduced. A multi-tone photomask can achieve three levels of light exposure to obtain an exposed portion, a half-exposed portion, and an unexposed portion; one-time exposure and development process allows a resist mask with regions of plural thicknesses (typically, two kinds of thicknesses) to be formed.

Figure 8A:
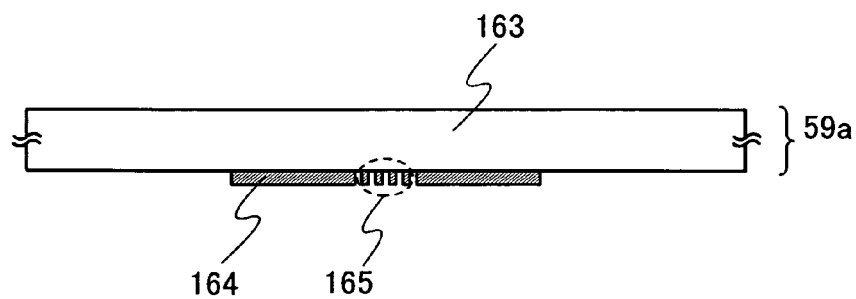
FIGS. 8A and 8B are diagrams illustrating a multi-tone photomask applicable to the present invention.
Figure 8B:
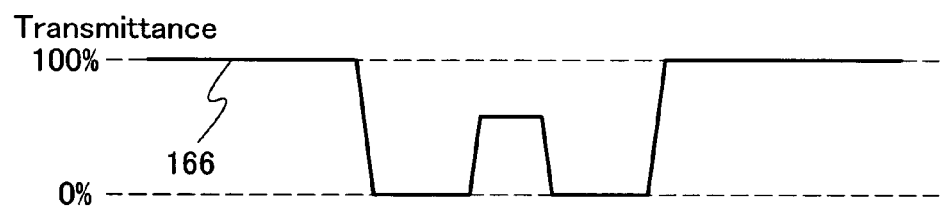
Figure 9A:
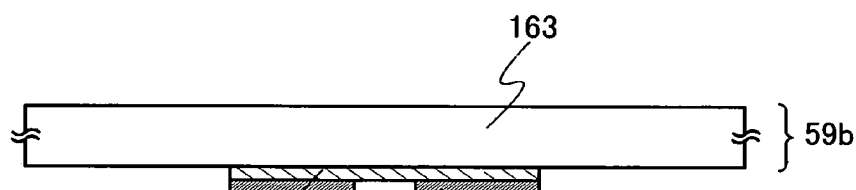
FIGS. 9A and 9B are diagrams illustrating a multi-tone photomask applicable to the present invention.
Figure 9B:
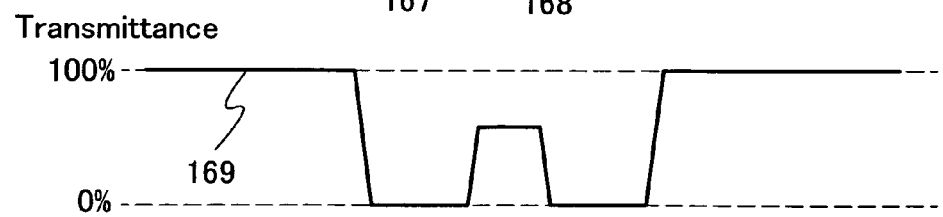

Typical examples of a multi-tone photomask include a gray-tone mask 59a as shown in FIGS. 8A and 8B, and a half-tone mask 59b as shown in FIGS. 9A and 9B.

As shown in FIG. 8A, the gray-tone mask 59a includes a substrate 163 that can transmit light, and a light block portion 164 and a diffraction grating 165 that are formed thereon. The light transmittance of the light block portion 164 is 0%. The diffraction grating 165 has a light transmit portion in a slit form, a dot form, a mesh form, or the like with intervals less than or equal to the resolution limit of light used for the exposure; thus, the light transmittance can be controlled. The diffraction grating 165 can be in a slit form, a dot form, or a mesh form with regular intervals; or in a slit form, a dot form, or a mesh form with irregular intervals.

For the substrate 163 that can transmit light, a substrate that can transmit light, such as a quartz substrate, can be used. The light block portion 164 and the diffraction grating 165 can be formed using a light block material such as chromium or chromium oxide, which absorbs light.

When the gray-tone mask 59a is irradiated with light for exposure, a light transmittance 166 of the light block portion 164 is 0% and that of a region where neither the light block portion 164 nor the diffraction grating 165 are provided is 100%, as shown in FIG. 8B. The light transmittance of the diffraction grating 165 can be controlled in a range of 10 to 70%. The light transmittance of the diffraction grating 165 can be controlled with an interval or a pitch of slits, dots, or meshes of the diffraction grating 165.

As shown in FIG. 9A, the half-tone mask 59b includes the substrate 163 that can transmit light, and a semi-transmissive portion 167 and a light block portion 168 that are formed thereon. The semi-transmissive portion 167 can be formed using MoSiN, MoSi, MoSiO, MoSiON, CrSi, or the like. The light block portion 168 can be formed using a light block material such as chromium or chromium oxide, which absorbs light.

When the half-tone mask 59b is irradiated with light for exposure, the light transmittance 169 of the light block portion 168 is 0% and that of a region where neither the light block portion 168 nor the semi-transmissive portion 167 is provided is 100%, as shown in FIG. 9B. The light transmittance of the semi-transmissive portion 167 can be controlled in a range of 10 to 70%. The light transmittance of the semi-transmissive portion 167 can be controlled with the material of the semi-transmissive portion 167.

After the light exposure using the multi-tone photomask, development is carried out, whereby resist masks 61 and 62 with regions having different thicknesses can be formed, as shown in FIG. 1C.

Next, with the resist masks 61 and 62, the microcrystalline semiconductor film 54, the antioxidant film 55, the semiconductor film 56, and the conductive film 57 are etched to be separated in island shapes. As a result, microcrystalline semiconductor films 69 and 70, antioxidant films 67 and 68, semiconductor films 65 and 66 to which the impurity element imparting one conductivity type is added (hereinafter, the semiconductor films 65 and 66), and conductive films 63 and 64 can be formed, as shown in FIG. 2A.

Next, the resist masks 61 and 62 are ashed. As a result, the areas and the thicknesses of the resist masks are reduced. At this time, the resist masks in regions with a small thickness (regions overlapping with part of the gate electrode 51 or 52) are removed to form separated resist masks 71 and 72, as shown in FIG. 2B.

Next, using the resist masks 71 and 72, the semiconductor films 65 and 66 and the conductive films 63 and 64 are etched to be separated. As a result, a pair of source and drain electrodes 73 and 74, a pair of source and drain electrodes 75 and 76, a pair of source and drain regions 77 and 78, and a pair of source and drain regions 79 and 80 can be formed, as shown in FIG. 2C. In this etching process, parts of the antioxidant films 67 and 68 are also etched. The antioxidant films which are etched partly and have recessed portions are referred to as antioxidant films 81 and 82. If the antioxidant film is separated at this time, a surface of the microcrystalline semiconductor film may undergo plasma treatment with nitrogen, hydrogen, or halogen to nitride, hydrogenate, or halogenate the surface. The antioxidant films 81 and 82 have end portions located beyond the source and drain electrodes because the antioxidant films 81 and 82 are partly etched using the resist masks 71 and 72 with reduced areas.

According to this embodiment mode, the source and drain regions and the recessed portions of the antioxidant films 81 and 82 can be formed in the same process. The recessed portions of the antioxidant films 81 and 82 are formed with depths which is ½ to ⅓ of the largest thicknesses of the antioxidant films 81 and 82, so that the source and drain regions can be separated from each other with some distance; thus, leakage current between the source and drain regions can be reduced.

Through the above process, channel-etched thin film transistors 85 and 86 can be formed, as shown in FIG. 3A. With channel-etched thin film transistor, the number of manufacturing steps can be reduced and the cost can be reduced. In addition, by formation of the channel formation region using a microcrystalline semiconductor film, a field effect mobility of 2 to 10 cm$^2$/V·sec can be obtained. Therefore, these thin film transistors can be used as a switching element of a pixel in a pixel portion 122 and an element included in a driver circuit 121 on a scanning line (or a gate line) side, respectively.

Next, an insulating film 87 having a contact hole is formed over the thin film transistors 85 and 86, and a pixel electrode 88 in contact with any one of the source or drain electrode 73 to 76 through the contact hole of the insulating film 87 is formed.

The insulating film 87 can be formed in a similar manner to the gate insulating film 53. The insulating film 87 is provided to prevent contamination impurities such as organic substances, metals, or moisture contained in the atmosphere from entering, and is preferably a dense film. By formation of the insulating film 87 using a silicon nitride film, the oxygen concentration in the antioxidant films 81 and 82 can be set to be $5 \times 10^{19}$ atoms/cm$^3$ or less, preferably $1 \times 10^{19}$ atoms/cm$^3$ or less.

The pixel electrode 88 can be formed of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

This embodiment mode shows an example in which a transmissive liquid crystal display device is manufactured by forming the pixel electrode 88 using a light-transmitting conductive material; however, the liquid crystal display device of the present invention is not limited to this structure. By formation of the pixel electrode using a conductive film which can easily reflect light, a reflective liquid crystal display device can be formed. In that case, part of the source or drain electrode 76 can be used as the pixel electrode.

Next, a spacer 133 is formed using an insulating film over the insulating film 87 or the pixel electrode 88. FIG. 3B illustrates an example in which the spacer 133 is formed using silicon oxide over the insulating film 87. There is no particular limitation on the order of forming the pixel electrode 88 and the spacer 133. Although a columnar spacer is formed as the spacer 133 in this embodiment mode, bead spacers may also be dispersed.

Then, an alignment film 131 is formed so as to cover the insulating film 87, the spacer 133, and the pixel electrode 88, and undergoes rubbing treatment.

Next, a sealant 162 for sealing liquid crystal is formed. Further, a second substrate 140 provided with a counter electrode 141 formed using a light-transmitting conductive material and an alignment film 142 to which has undergone rubbing treatment is prepared. Then, liquid crystal 161 is dripped to a region surrounded by the sealant 162, and the second substrate 140, which is prepared separately, is attached to the first substrate 120 using the sealant 162 such that the counter electrode 141 and the pixel electrode 88 face each other. A filler may be mixed in the sealant 162.

Alternatively, the sealant 162 may be provided for the second substrate 140, and the liquid crystal 161 may be dripped to a region surrounded by the sealant 162, and then, the first substrate 120 and the second substrate 140 are attached to each other using the sealant 162.

A dispenser method (a dripping method) is used for injecting the liquid crystal; however, the present invention is not limited thereto. A dipping method (pumping method), in which the liquid crystal is injected utilizing a capillary phenomenon after attaching the first substrate 120 and the second substrate 140 to each other using the sealant 162, may also be used.

A color filter, a blocking film for preventing disinclination (a black matrix), or the like may also be provided for the first substrate 120 or the second substrate 140. Further, a polarizing plate 150 is attached to a surface of the first substrate 120 which is opposite to the surface provided with the thin film transistor, and a polarizing plate 151 is attached to a surface of the second substrate 140 which is opposite to the surface provided with the counter electrode 141.

The counter electrode 141 can be formed using a similar material to the pixel electrode 88 as appropriate. A liquid crystal element 132 corresponds to a region where the pixel electrode 88 and the counter electrode 141 sandwich the liquid crystal 161.

Through the above steps, the liquid crystal display device can be manufactured.

Although FIGS. 1A to 3B illustrate a method for manufacturing a liquid crystal display device including a channel-etched thin film transistor, the liquid crystal display device can also be formed using a channel-protective thin film transistor. FIGS. 4A to 5C illustrate a method for manufacturing a liquid crystal display device using a channel-protective thin film transistor.

As shown in FIG. 4A, gate electrodes 51 and 52 are formed over a substrate 50. Subsequently, a gate insulating film 53, a microcrystalline semiconductor film 54, an antioxidant film 55, and an insulating film 91 are formed over the gate electrodes 51 and 52. As the insulating film 91, a silicon nitride film, a silicon nitride oxide film, a silicon oxide film, or a silicon oxynitride film can be formed over the microcrystalline semiconductor film 54 by a sputtering method, a CVD method, or the like. Further, the insulating film 91 can also be formed by discharging polyimide, acrylic, or a composition including siloxane by an inkjet method or a printing method and baking it.

Subsequently, the insulating film 91 is etched partly to form channel protective films 92 and 93 over the microcrystalline semiconductor film 54 so as to overlap with the gate electrodes 51 and 52, respectively, as shown in FIG. 4B. The antioxidant film 55 can prevent the microcrystalline semiconductor film from being oxidized. Further, the antioxidant film 55 also functions as an etching protective film in forming the channel protective films 92 and 93 by etching the insulating film 91 in the above step.

Then, as shown in FIG. 4C, a semiconductor film 94 to which an impurity element imparting one conductivity type is added (hereinafter simply referred to as the semiconductor film 94) is formed over the channel protective films 92 and 93. A conductive film 95 is formed over the semiconductor film 94. Resist masks 61 and 62 are formed using a multi-tone photomask over the conductive film 95. The semiconductor film 94 can be formed in a similar manner to the semiconductor film 56 illustrated in FIG. 1B. The conductive film 95 can be formed in a similar manner to the conductive film 57 illustrated in FIG. 1B.

Subsequently, the conductive film 95, the semiconductor film 94, and the microcrystalline semiconductor film 54 are etched to be separated using the resist masks 61 and 62 that are formed by a photolithography technique in which the multi-tone photomask is used, so that microcrystalline semiconductor films 69 and 70 functioning as channel formation regions, antioxidant films 67 and 68, semiconductor films 98 and 99 to which the impurity element imparting one conductivity type is added (hereinafter referred to as the semiconductor films 98 and 99), and conductive films 96 and 97 are formed as illustrated in FIG. 5A.

Subsequently, the resist masks 61 and 62 are ashed to form separated resist masks 71 and 72, as shown in FIG. 5B.

Subsequently, using the resist masks 71 and 72 as masks, the conductive films 96 and 97 are etched to form a pair of source and drain electrodes 101 and 102, and a pair of source and drain electrodes 103 and 104; and the semiconductor films 98 and 99 are etched to form a pair of source and drain regions 105 and 106, and a pair of source and drain regions 107 and 108, as shown in FIG. 5C. At this time, parts of the channel protective films 92 and 93 are etched to be channel protective films 92a and 93a. Further, the antioxidant films 67 and 68 are also etched partly to be antioxidant films 109 and 110.

Through the above process, a channel protective thin film transistor 118 including the channel protective film 92a that overlaps with the gate electrode 51 and the microcrystalline semiconductor 69, and a channel protective thin film transistor 119 including the channel protective film 93a that overlaps with the gate electrode 52 and the microcrystalline semiconductor film 70 can be manufactured. Formation of the channel protective thin film transistors over an element substrate can reduce variations in element characteristics of the thin film transistors and reduce off current. Further, by formation of the channel formation region using the microcrystalline semiconductor film, a field effect mobility of 2 to 10 cm$^2$/V·sec can be obtained. Therefore, these thin film transistors can be used for a switching element of a pixel in a pixel portion 122 and an element included in a driver circuit 121 on a scanning line (or gate line) side, respectively.

As a thin film transistor included in the driver circuit 121 and a thin film transistor serving as a switching element of the pixel portion 122 over the element substrate, staggered thin film transistors can be used. The element substrate is illustrated in FIG. 6.

In staggered thin film transistors, source and drain wirings 41a to 41d are formed over an insulating film 40 serving as a base film formed over a substrate 50. Subsequently, a microcrystalline semiconductor film 42 is formed over the source and drain wirings 41a to 41d. Then, an antioxidant film 43 is formed over the microcrystalline semiconductor film 42. Next, a gate insulating film 44 is formed over the antioxidant film 43, the microcrystalline semiconductor film 42, and the source and drain wirings 41a to 41d. Subsequently, a gate electrode 45 is formed over the gate insulating film 44. Next, a protective film 46 is formed over the gate insulating film 44 and the gate electrode 45. A pixel electrode 47 is formed which is connected to the source or drain wiring 41d of the thin film transistor serving as a pixel thin film transistor of the pixel portion 122 in a contact hole formed in the protective film 46 and the gate insulating film 44.

The source and drain wirings 41a to 41d can be formed in a similar manner to the gate electrodes 51 and 52 shown in FIG. 1A. The microcrystalline semiconductor film 42 can be formed in a similar manner to the microcrystalline semiconductor film 54 shown in FIG. 1A. The antioxidant film 43 can be formed in a similar manner to the antioxidant film 55 shown in FIG. 1A. The gate insulating film 44 can be formed in a similar manner to the gate insulating film 53 shown in FIG. 1A. The gate electrode 45 can be formed in a similar manner to the conductive film 57 shown in FIG. 1B. The protective film 46 can be formed in a similar manner to the insulating film 87 shown in FIG. 3A. The pixel electrode 47 can be formed in a similar manner to the pixel electrode 88 shown in FIG. 3A.

In this embodiment mode, the microcrystalline semiconductor film 42 is formed to be in contact with the source and drain wirings 41a and 41b. However, a pair of semiconductor films including an impurity element imparting one conductivity type may be formed between the source and drain wirings 41a and 41b and the microcrystalline semiconductor film 42.

Now, a method for manufacturing a light-emitting display device is described as another display device with reference to FIGS. 1A to 3B and 7A and 7B. Although a light-emitting display device using the channel-etched thin film transistor shown in FIG. 3C is illustrated here, a channel-protective thin film transistor or a staggered thin film transistor can be used as appropriate.

Through the steps shown in FIGS. 1A to 3A, the thin film transistors 85 and 86 are formed over the substrate 50, and the insulating film 87 serving as a protective film is formed over the thin film transistors 85 and 86, as shown in FIGS. 7A and 7B. Subsequently, a planarization film 111 with a contact hole is formed over the insulating film 87, and a pixel electrode 112 that is connected to the source or drain electrode of the thin film transistor 86 is formed over the planarization film 111.

It is preferable to form the planarization film 111 using an organic resin such as acrylic, polyimide, or polyamide, or siloxane.

In FIG. 7A, it is preferable to use a cathode as the pixel electrode 112 because the thin film transistor of a pixel is an n-channel TFT, if the thin film transistor of the pixel is a p-channel TFT, it is preferable to use an anode as the pixel electrode 112. Specifically, for the cathode, a known material with a low work function, such as Ca, Al, CaF, MgAg, or AlLi can be used.

Subsequently, as shown in FIG. 7B, a partition wall 113 is formed over the planarization film 111 and an end portion of the pixel electrode 112. The partition wall 113 has an opening portion, and the pixel electrode 112 is exposed in the opening portion. The partition wall 113 is formed using an organic resin film, an inorganic insulating film, or an organic polysiloxane film. In particular, it is preferable that the partition wall 113 be formed of a photosensitive material, and the opening portion be formed over the pixel electrode, and a side wall of the opening portion form an inclined surface with a continuous curvature.

Then, a light-emitting layer 114 is formed so as to be in contact with the pixel electrode 112 in the opening portion of the partition wall 113. The light-emitting layer 114 may be formed using a single layer or by stacking a plurality of layers.

Subsequently, a common electrode 115 is formed using an anode material so as to cover the light-emitting layer 114. The common electrode 115 can be formed using a light-transmitting conductive film formed using a light-transmitting conductive material which is given as the pixel electrode 88 of the liquid crystal display device. The common electrode 115 may also be formed using a titanium nitride film or a titanium film as well as the above light-transmitting conductive film. In FIG. 7B, the common electrode 115 is formed using ITO. In the opening portion of the partition wall 113, the pixel electrode 112, the light-emitting layer 114, and the common electrode 115 overlap with each other, so that a light-emitting element 117 is formed. After that, a protective film 116 is preferably formed over the common electrode 115 and the partition wall 113 so that oxygen, hydrogen, moisture, carbon dioxide, or the like does not enter the light-emitting element 117. As the protective film 116, a silicon nitride film, a silicon nitride oxide film, a DLC film, or the like can be formed.

Further, in a practical case, it is preferable that a display device completed to the state illustrated in FIG. 7B be packaged (sealed) with a protective film (such as a laminated film or an ultraviolet curable resin film) or a cover material with high air-tightness and little degasification so that the display device is not exposed to outside air.

Next, a structure of a light-emitting element is described with reference to FIGS. 14A to 14C. A cross-sectional structure of a pixel is described by taking an n-channel driving TFT as an example.

In order to extract light emission of a light-emitting element, at least one of an anode and a cathode may be transparent. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure of the present invention can be applied to a light-emitting element having any of these emission structures.

A light-emitting element having the top emission structure is described with reference to FIG. 14A.

Figure 14A:
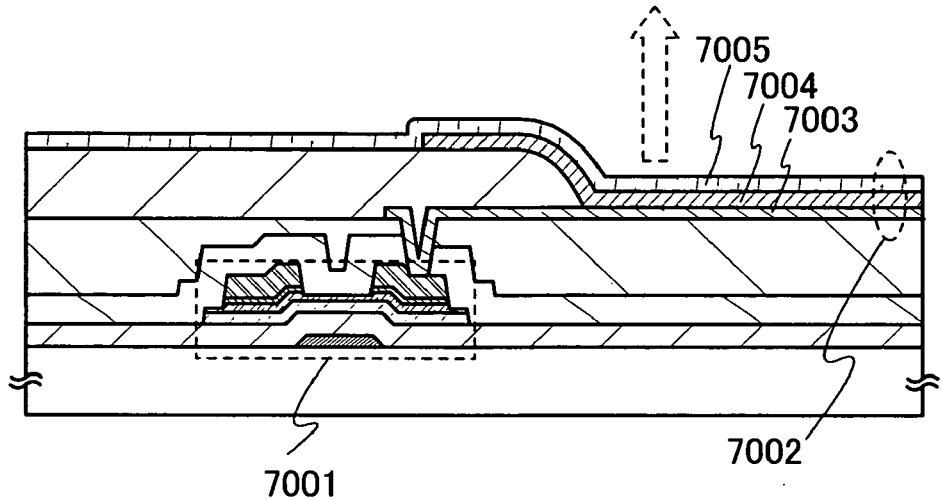
FIGS. 14A to 14C are cross-sectional views illustrating pixels in light-emitting devices applicable to the present invention.

FIG. 14A is a cross-sectional view of a pixel in a case where a driving TFT 7001 is an n-channel TFT, and light generated in a light-emitting element 7002 is emitted to pass through an anode 7005. In FIG. 14A, a cathode 7003 of the light-emitting element 7002 and the driving TFT 7001 are electrically connected to each other. An EL layer 7004 and the anode 7005 are stacked in order over the cathode 7003. As the cathode 7003, a known conductive film can be used as long as it has a low work function and reflects light. For example, Ca, Al, CaF, MgAg, AlLi, or the like is preferably used. The EL layer 7004 may be formed using a single layer or by stacking a plurality of layers. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

The light-emitting element 7002 corresponds to a region where the cathode 7003 and the anode 7005 sandwich the EL layer 7004. In the pixel illustrated in FIG. 14A, light generated in the light-emitting element 7002 is emitted to pass through the anode 7005 as shown by an outline arrow.

Then, a light-emitting element having the bottom emission structure is described with reference to FIG. 14B. FIG. 14B is a cross-sectional view of a pixel in a case where a driving TFT 7011 is an n-channel TFT, and light generated in a light-emitting element 7012 is emitted to pass through a cathode 7013. In FIG. 14B, the cathode 7013 of the light-emitting element 7012 is formed over a light-transmitting conductive film 7017 that is electrically connected to the driving TFT 7011, and a EL layer 7014 and an anode 7015 are stacked in order over the cathode 7013. A blocking film 7016 for reflecting or blocking light may be formed so as to cover the anode 7015 when the anode 7015 has a light-transmitting property. As the cathode 7013, a known conductive film can be used as in the case of FIG. 14A as long as it has a low work function.

The cathode 7013 has a thickness that can transmit light (preferably, approximately from 5 nm to 30 nm). For example, an Al film having a thickness of 20 nm can be used as the cathode 7013. The EL layer 7014 may be formed of a single layer or by stacking a plurality of layers as in the case of FIG. 14A. The anode 7015 is not required to transmit light therethrough, but can be formed using a light-transmitting conductive film as in the case of FIG. 14A. As the blocking film 7016, a metal or the like that reflects light can be used; however, it is not limited to a metal film. For example, a resin or the like to which black pigments are added can be used.

The light-emitting element 7012 corresponds to a region where the cathode 7013 and the anode 7015 sandwich the EL layer 7014. In the pixel illustrated in FIG. 14B, light generated in the light-emitting element 7012 is emitted to pass through the cathode 7013 as shown by an outline arrow.

Now a light-emitting element having the dual emission structure is described with reference to FIG. 14C. In FIG. 14C, a cathode 7023 of a light-emitting element 7022 is formed over a light-transmitting conductive film 7027 that is electrically connected to a driving TFT 7021, and a EL layer 7024 and an anode 7025 are stacked in order over the cathode 7023. As the cathode 7023, a known conductive film can be used as long as it has a low work function as in the case of FIG. 14A. The cathode 7023 has a thickness that can transmit light. For example, an Al film having a thickness of 20 nm can be used as the cathode 7023. The EL layer 7024 may be formed using a single layer or by stacking a plurality of layers as in the case of FIG. 14A. The anode 7025 can be formed using a light-transmitting conductive film as in the case of FIG. 14A.

The light-emitting element 7022 corresponds to a region where the cathode 7023 and the anode 7025 sandwich the EL layer 7024. In the pixel illustrated in FIG. 14C, light generated in the light-emitting element 7022 is emitted to pass through both the anode 7025 and the cathode 7023 as shown by outline arrows.

This embodiment mode describes an example in which the driving TFT is electrically connected to the light-emitting element. However, a current control TFT may also be formed between the driving TFT and the light-emitting element to be connected to them.

Figure 14B:
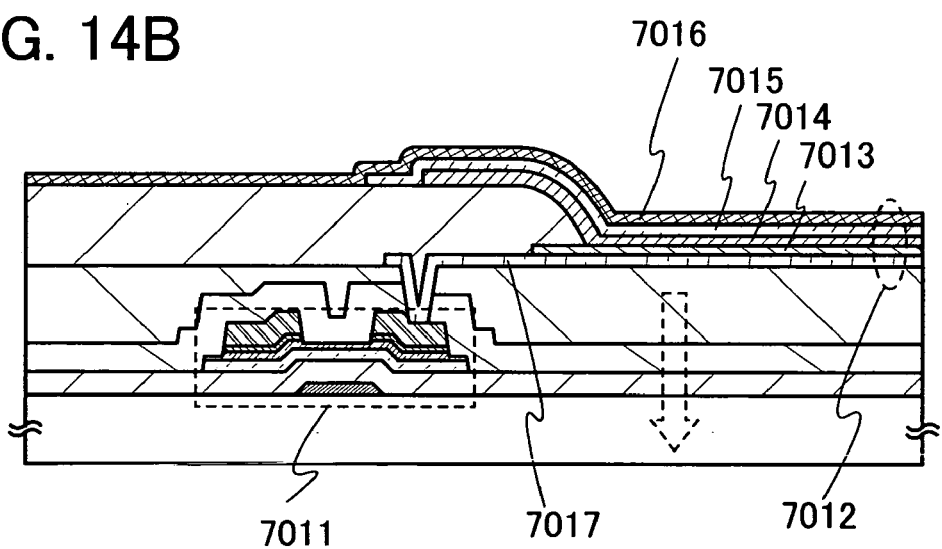
Figure 14C:
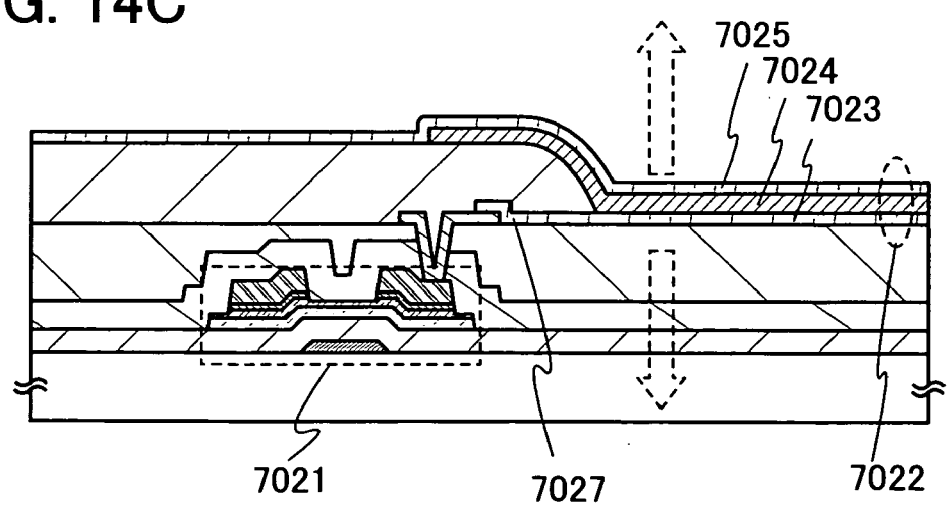

A light-emitting device described in this embodiment mode is not limited to the structures illustrated in FIGS. 14A to 14C, and can be modified in various ways based on the spirit of techniques according to the present invention.

Through the above process, a display device can be manufactured. Formation of an antioxidant film on a surface of a microcrystalline semiconductor film can prevent a surface of a crystal grain included in the microcrystalline semiconductor film from being oxidized naturally, and thus can prevent the characteristics of a thin film transistor from deteriorating.

Further, a thin film transistor is formed using a multi-tone photomask, and thus the number of photomasks can be reduced; accordingly, reduction in cost is possible.

Since plasma generated in the microwave plasma CVD apparatus with a frequency of 1 GHz or more has high electron density, a deposition rate of a microcrystalline semiconductor film can be increased with use of this apparatus. Thus, mass productivity of display devices having thin film transistors including microcrystalline semiconductor films can be improved. In addition, a microwave plasma CVD apparatus including a plurality of microwave generation units and a plurality of dielectric plates can generate stable large-area plasma. Hence, a display device can be manufactured using a large-sized substrate, and thus mass productivity can be improved.

Embodiment Mode 2

This embodiment mode describes a structure of a display panel, which is one mode of the display device of the present invention.

Figure 15A:
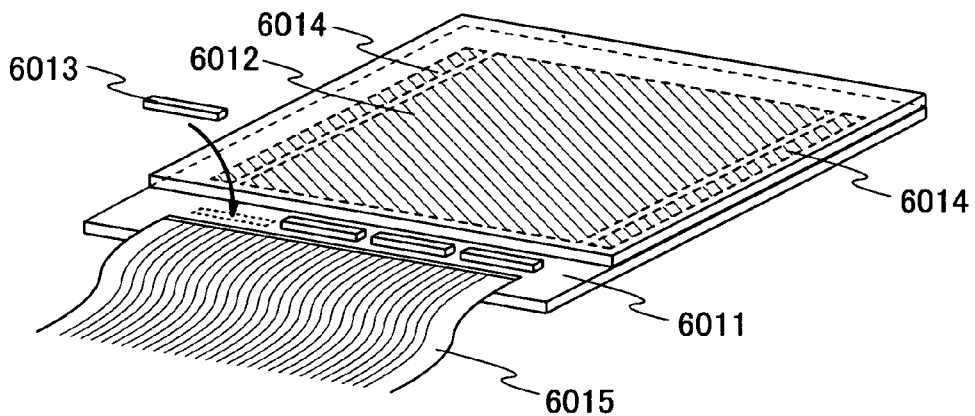
FIGS. 15A to 15C are perspective views illustrating display panels.

FIG. 15A illustrates a mode of a display panel in which a pixel portion 6012 formed over a substrate 6011 is connected to a signal line driver circuit 6013 that is formed separately. The pixel portion 6012 and a scanning line driver circuit 6014 are each formed using a thin film transistor including a microcrystalline semiconductor film. By forming the signal line driver circuit with a thin film transistor by which higher mobility can be obtained compared to the thin film transistor including the microcrystalline semiconductor film, operation of the signal line driver circuit, which demands a higher driving frequency than that of the scanning line driver circuit, can be stabilized. The signal line driver circuit 6013 may be formed using a thin film transistor including a single-crystalline semiconductor, a thin film transistor including a polycrystalline semiconductor, or a thin film transistor including an SOI. The pixel portion 6012, the signal line driver circuit 6013, and the scanning line driver circuit 6014 are each supplied with potential of a power source, a variety of signals, and the like through an FPC 6015.

Both the signal driver circuit and the scanning line driver circuit may be formed over the same substrate as that of the pixel portion.

Figure 15B:
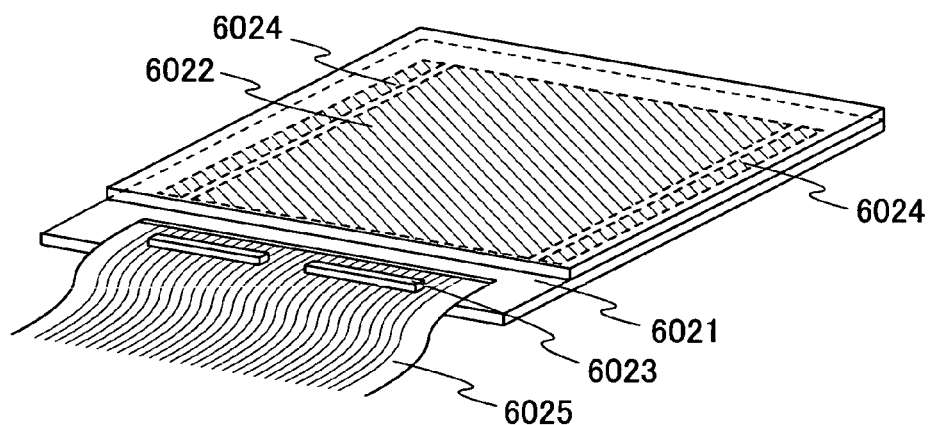

Further, when the driver circuit is formed separately, a substrate provided with the driver circuit is not always required to be attached to a substrate provided with the pixel portion, and may be attached to, for example, the FPC. FIG. 15B illustrates a mode of a panel of a display device in which a signal line driver circuit 6023 is formed separately and is connected to a pixel portion 6022 and a scanning line driver circuit 6024 that are formed over a substrate 6021. The pixel portion 6022 and the scanning line driver circuit 6024 are each formed using a thin film transistor including a microcrystalline semiconductor film. The signal line driver circuit 6023 is connected to the pixel portion 6022 through an FPC 6025. The pixel portion 6022, the signal line driver circuit 6023, and the scanning line driver circuit 6024 are each supplied with potential of a power source, a variety of signals, and the like through the FPC 6025.

Figure 15C:
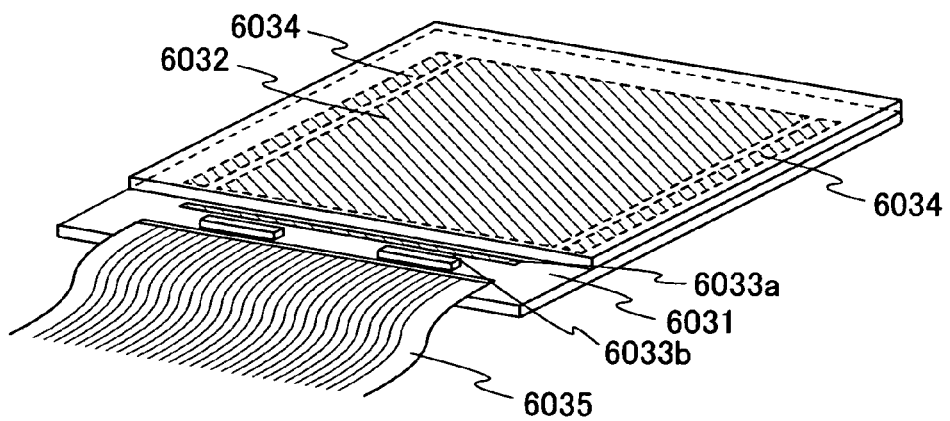

Furthermore, only a part of the signal line driver circuit or only a part of the scanning line driver circuit may be formed over the same substrate as that of the pixel portion using the thin film transistor including a microcrystalline semiconductor film, and the rest may be formed separately and electrically connected to the pixel portion. FIG. 15C illustrates a mode of a display panel in which an analog switch 6033a included in the signal driver circuit is formed over a substrate 6031, over which a pixel portion 6032 and a scanning line driver circuit 6034 are formed, and a shift register 6033b included in the signal line driver circuit is formed separately over a different substrate and then attached to the substrate 6031. The pixel portion 6032 and the scanning line driver circuit 6034 are each formed using the thin film transistor including a microcrystalline semiconductor film. The shift register 6033b included in the signal line driver circuit is connected to the pixel portion 6032 through an FPC 6035. The pixel portion 6032, the signal line driver circuit, and the scanning line driver circuit 6034 are each supplied with potential of a power source, a variety of signals, and the like through the FPC 6035.

As illustrated in FIGS. 15A to 15C, in the display device of the present invention, an entire driver circuit or a part thereof can be formed over the same substrate as that of a pixel portion, using the thin film transistor including a microcrystalline semiconductor film.

Note that there are no particular limitations on a connection method of a substrate formed separately, and a known method such as a COG method, a wire bonding method, or a TAB method can be used. Further, a connection position is not limited to the position illustrated in FIGS. 15A to 15C as long as electrical connection is possible. Further, a controller, a CPU, a memory, or the like may be formed separately and connected.

The signal line driver circuit used in the present invention is not limited to a mode including only a shift register and an analog switch. In addition to the shift register and the analog switch, another circuit such as a buffer, a level shifter, or a source follower may be included. Further, the shift register and the analog switch are not always required to be provided, and for example, a different circuit such as a decoder circuit by which selection of signal lines is possible may be used instead of the shift register, or a latch or the like may be used instead of the analog switch.

Figure 16:
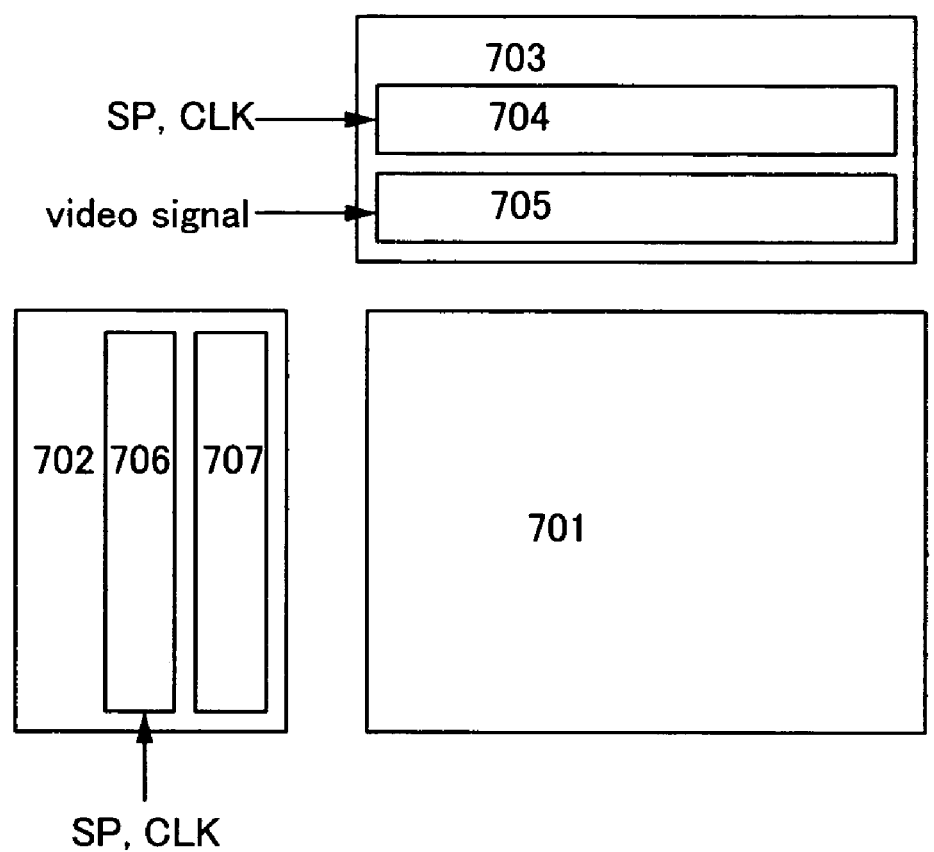
FIG. 16 is a block diagram illustrating a structure of a display device applicable to the present invention.

FIG. 16 is a block diagram of a display device of the present invention. The display device illustrated in FIG. 16 includes a pixel portion 701 including a plurality of pixels that is each provided with a display element; a scanning line driver circuit 702 that selects each pixel; and a signal line driver circuit 703 that controls a video signal input to a selected pixel.

In FIG. 16, the signal line driver circuit 703 includes a shift register 704 and an analog switch 705. A clock signal (CLK) and a start pulse signal (SP) are input to the shift register 704. When the clock signal (CLK) and the start pulse signal (SP) are input, timing signals are generated in the shift register 704, and input to the analog switch 705.

Further, video signals are input to the analog switch 705. The analog switch 705 samples the video signals according to the input timing signals and distributes the video signals to signal lines of latter stages.

Next, a configuration of the scanning line driver circuit 702 is described. The scanning line driver circuit 702 includes a shift register 706 and a buffer 707. Further, a level shifter may be included. In the scanning line driver circuit 702, a selection signal is generated by inputting a clock signal (CLK) and a start pulse signal (SP) to the shift register 706. The generated selection signal is buffer-amplified in the buffer 707, and then supplied to a corresponding scanning line. Gates of transistors in pixels of one line are connected to the scanning line. Further, since the transistors in the pixels of one line have to be turned on at the same time, a buffer to which a large current can be fed is used for the buffer 707.

In a full color display device, when video signals corresponding to R (red), G (green), and B (blue) are sampled in sequence and are each supplied to a corresponding signal line, the number of terminals for connecting the shift register 704 and the analog switch 705 corresponds to about ⅓ of the number of terminals for connecting the analog switch 705 and the signal lines of the pixel portion 701. Consequently, by forming the analog switch 705 and the pixel portion 701 over the same substrate, the number of terminals used for connecting a substrate over which a pixel portion is formed to a substrate which is formed separately can be suppressed compared to a case of forming the analog switch 705 and the pixel portion 701 over different substrates, and occurrence probability of poor connection can be suppressed, and the yield can be increased.

Although the scanning line driver circuit 702 in FIG. 16 includes the shift register 706 and the buffer 707, the scanning line driver circuit 702 may be constituted of only the shift register 706.

Note that the configuration illustrated in FIG. 16 is merely a mode of a display device of the present invention, and the configurations of a signal line driver circuit and a scanning line driver circuit are not limited thereto.

Figure 17:
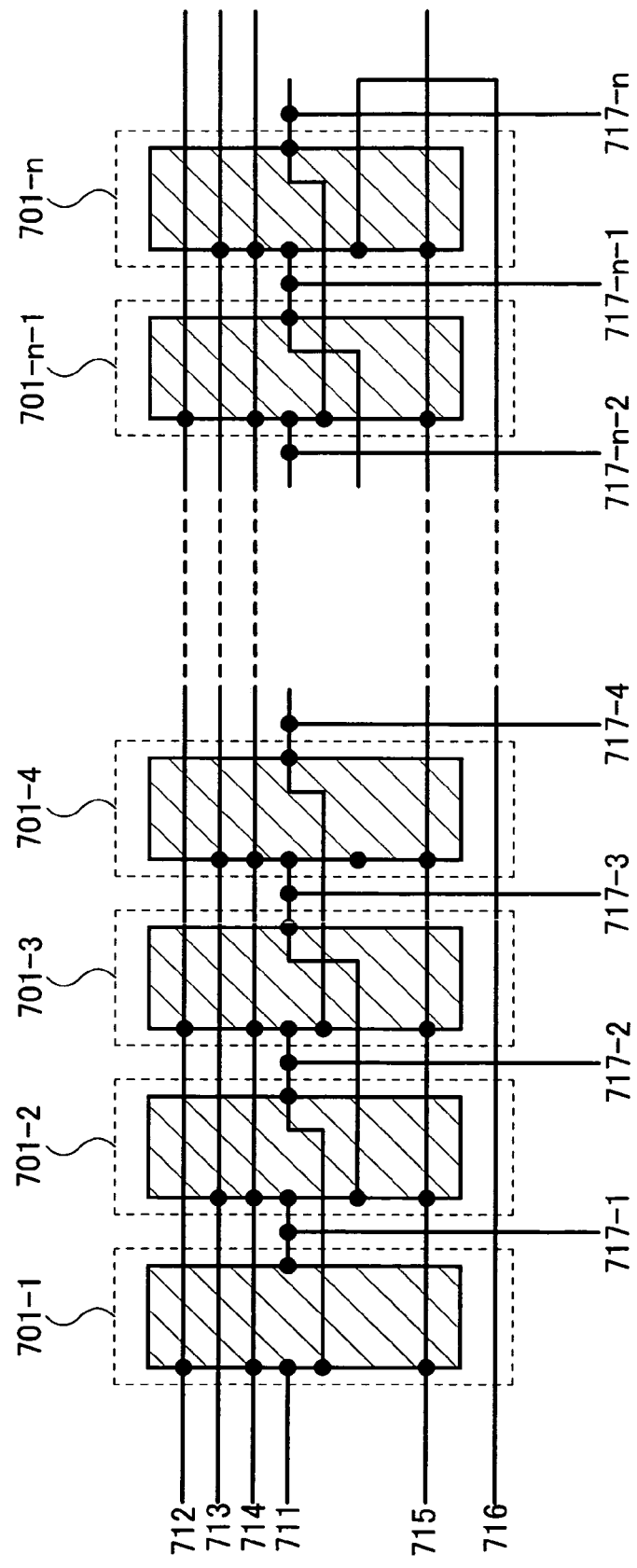
FIG. 17 is an equivalent circuit view illustrating a structure of a driver circuit of a display device applicable to the present invention.

Now a mode of a shift register including thin film transistors that include microcrystalline semiconductor films and have the same polarity is described with reference to FIGS. 17 and 18. FIG. 17 illustrates a structure of the shift register of this embodiment mode. The shift register shown in FIG. 17 includes a plurality of flip-flops 701-$i$ (any one of flip-flops 701-1 to 701-$n$). Further, the shift register operates by inputting a first clock signal, a second clock signal, a start pulse signal, and a reset signal.

Now connection relations of the shift register in FIG. 17 are described. In the flip-flop 701-$i$ in an i-th stage (any one of the flip-flops 701-1 to 701-$n$) of the shift register in FIG. 17, a first wiring 501 shown in FIG. 18 is connected to a seventh wiring 717-$i$−1; a second wiring 502 shown in FIG. 18 is connected to a seventh wiring 717-$i$+1; a third wiring 503 shown in FIG. 18 is connected to a seventh wiring 717-$i$; and a sixth wiring 506 shown in FIG. 18 is connected to a fifth wiring 715.

Figure 18:
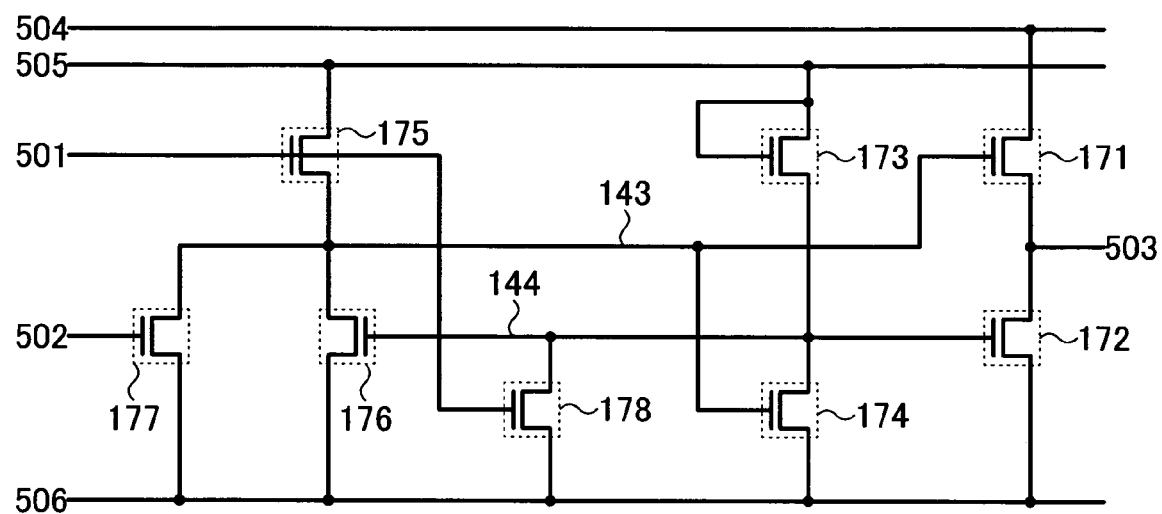
FIG. 18 is an equivalent circuit view illustrating a structure of a driver circuit of a display device applicable to the present invention.

A fourth wiring 504 shown in FIG. 18 is connected to a second wiring 712 in a flip-flop in an odd-numbered stage, and is connected to a third wiring 713 in a flip-flop in an even-numbered stage. A fifth wiring 505 shown in FIG. 18 is connected to a fourth wiring 714.

The first wiring 501 shown in FIG. 18 of the flip-flop 701-1 in a first stage is connected to a first wiring 711, and the second wiring 502 shown in FIG. 18 of the flip-flop 701-$n$ in an n-th stage is connected to the sixth wiring 716.

The first wiring 711, the second wiring 712, the third wiring 713, and the sixth wiring 716 can be called a first signal line, a second signal line, a third signal line, and a fourth signal line, respectively. Further, the fourth wiring 714 and the fifth wiring 715 can be called a first power supply line and a second power supply line, respectively.

FIG. 18 illustrates the flip-flop shown in FIG. 17 in detail. The flip-flop shown in FIG. 18 includes a first thin film transistor 171, a second thin film transistor 172, a third thin film transistor 173, a fourth thin film transistor 174, a fifth thin film transistor 175, a sixth thin film transistor 176, a seventh thin film transistor 177, and an eighth thin film transistor 178. In this embodiment mode, the first thin film transistor 171, the second thin film transistor 172, the third thin film transistor 173, the fourth thin film transistor 174, the fifth thin film transistor 175, the sixth thin film transistor 176, the seventh thin film transistor 177, and the eighth thin film transistor 178 are n-channel transistors, and are brought into conduction when a voltage between a gate and a source ($V_{gs}$) exceeds a threshold voltage ($V_{th}$).

Now a connection structure of the flip-flop shown in FIG. 17 is described below.

A first electrode (either a source electrode or a drain electrode) of the first thin film transistor 171 is connected to the fourth wiring 504, and a second electrode (either the source electrode or the drain electrode) of the first thin film transistor 171 is connected to the third wiring 503.

A first electrode of the second thin film transistor 172 is connected to the sixth wiring 506, and a second electrode of the second thin film transistor 172 is connected to the third wiring 503.

A first electrode of the third thin film transistor 173 is connected to the fifth wiring 505. A second electrode of the third thin film transistor 173 is connected to a gate electrode of the second thin film transistor 172. A gate electrode of the third thin film transistor 173 is connected to the fifth wiring 505.

A first electrode of the fourth thin film transistor 174 is connected to the sixth wiring 506. A second electrode of the fourth thin film transistor 174 is connected to the gate electrode of the second thin film transistor 172. A gate electrode of the fourth thin film transistor 174 is connected to a gate electrode of the first thin film transistor 171.

A first electrode of the fifth thin film transistor 175 is connected to the fifth wiring 505. A second electrode of the fifth thin film transistor 175 is connected to the gate electrode of the first thin film transistor 171. A gate electrode of the fifth thin film transistor 175 is connected to the first wiring 501.

A first electrode of the sixth thin film transistor 176 is connected to the sixth wiring 506. A second electrode of the sixth thin film transistor 176 is connected to the gate electrode of the first thin film transistor 171. A gate electrode of the sixth thin film transistor 176 is connected to the gate electrode of the second thin film transistor 172.

A first electrode of the seventh thin film transistor 177 is connected to the sixth wiring 506. A second electrode of the seventh thin film transistor 177 is connected to the gate electrode of the first thin film transistor 171. A gate electrode of the seventh thin film transistor 177 is connected to the second wiring 502.

A first electrode of the eighth thin film transistor 178 is connected to the sixth wiring 506. A second electrode of the eighth thin film transistor 178 is connected to the gate electrode of the second thin film transistor 172. A gate electrode of the eighth thin film transistor 178 is connected to the first wiring 501.

A part where the gate electrode of the first thin film transistor 171, the gate electrode of the fourth thin film transistor 174, the second electrode of the fifth thin film transistor 175, the second electrode of the sixth thin film transistor 176, and the second electrode of the seventh thin film transistor 177 are connected to each other is a node 143. Further, a part where the gate electrode of the second thin film transistor 172, the second electrode of the third thin film transistor 173, the second electrode of the fourth thin film transistor 174, the gate electrode of the sixth thin film transistor 176, and the second electrode of the eighth thin film transistor 178 are connected to each other is a node 144.

The first wiring 501, the second wiring 502, the third wiring 503, and the fourth wiring 504 can be called the first signal line, the second signal line, the third signal line, and the fourth signal line, respectively. Further, the fifth wiring 505 and the sixth wiring 506 can be called the first power supply line and the second power supply line, respectively.

Figure 19:
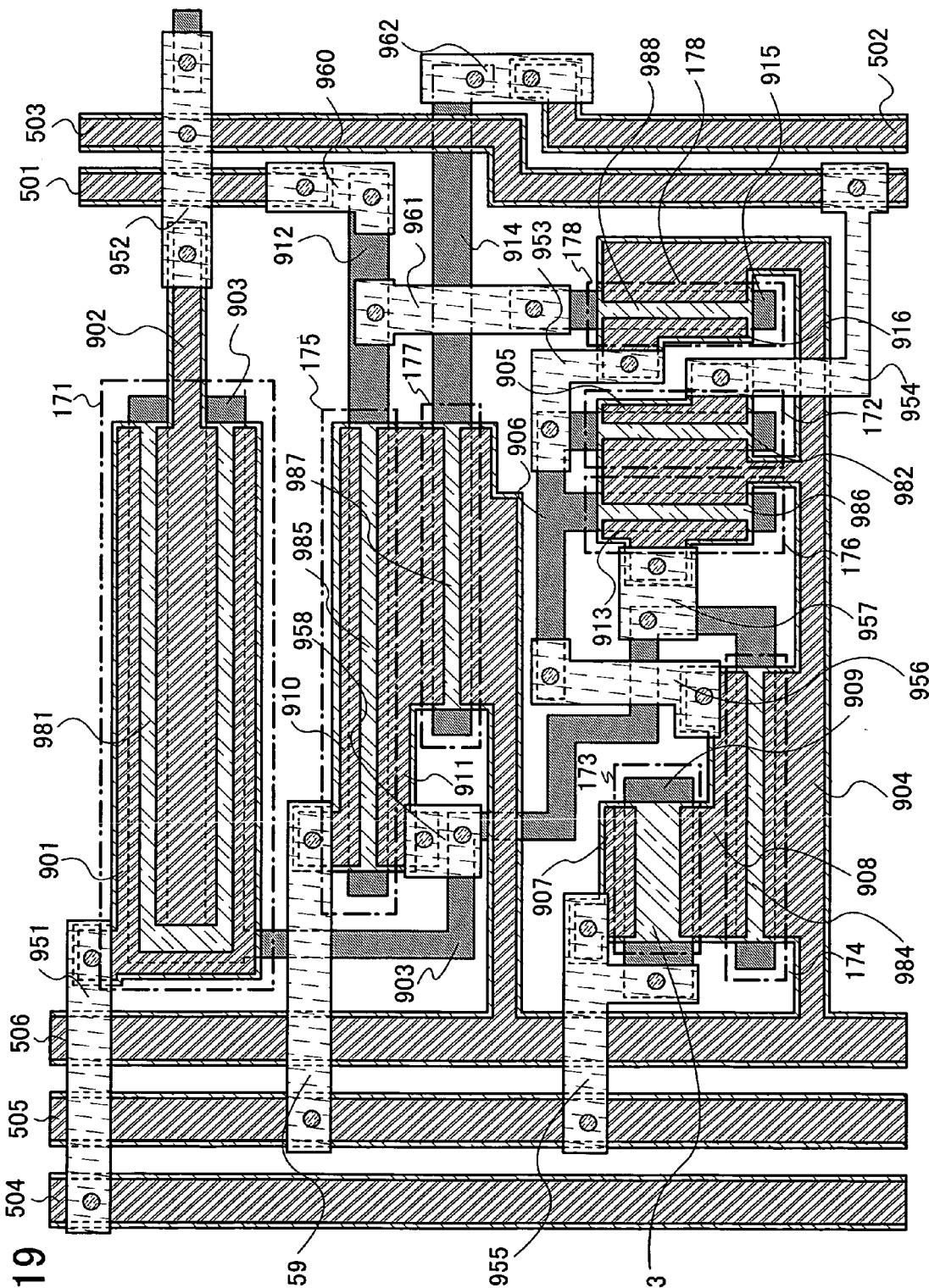
FIG. 19 is a top view illustrating a layout of a driver circuit of a display device applicable to the present invention.

FIG. 19 illustrates an example of a top view of the flip-flop shown in FIG. 18.

A conductive film 901 includes a part which functions as the first electrode of the first thin film transistor 171. The conductive film 901 is connected to the fourth wiring 504 through a wiring 951 that is formed at the same time as a pixel electrode.

A conductive film 902 includes a part which functions as the second electrode of the first thin film transistor 171. The conductive film 902 is connected to the third wiring 503 through a wiring 952 that is formed at the same time as the pixel electrode.

A conductive film 903 includes a part which functions as the gate electrode of the first thin film transistor 171 and a part which functions as the gate electrode of the fourth thin film transistor 174.

A conductive film 904 includes a part which functions as the first electrode of the second thin film transistor 172, a part which functions as the first electrode of the sixth thin film transistor 176, a part which functions as the first electrode of the fourth thin film transistor 174, and a part which functions as the first electrode of the eighth thin film transistor 178. The conductive film 904 is connected to the sixth wiring 506.

A conductive film 905 includes a part which functions as the second electrode of the second thin film transistor 172. The conductive film 905 is connected to the third wiring 503 through a wiring 954 that is formed at the same time as the pixel electrode.

A conductive film 906 includes a part which functions as the gate electrode of the second thin film transistor 172 and a part which functions as the gate electrode of the sixth thin film transistor 176.

A conductive film 907 includes a part which functions as the first electrode of the third thin film transistor 173. The conductive film 907 is connected to the fifth wiring 505 through a wiring 955.

A conductive film 908 includes a part which functions as the second electrode of the third thin film transistor 173 and a part which functions as the second electrode of the fourth thin film transistor 174. The conductive film 908 is connected to the conductive film 906 through a wiring 956 that is formed at the same time as the pixel electrode.

A conductive film 909 includes a part which functions as the gate electrode of the third thin film transistor 173. The conductive film 909 is connected to the fifth wiring 505 through the wiring 955.

A conductive film 910 includes a part which functions as the first electrode of the fifth thin film transistor 175. The conductive film 910 is connected to the fifth wiring 505 through a wiring 959 that is formed at the same time as the pixel electrode.

A conductive film 911 includes a part which functions as the second electrode of the fifth thin film transistor 175 and a part which functions as the second electrode of the seventh thin film transistor 177. The conductive film 911 is connected to the conductive film 903 through a wiring 958 that is formed at the same time as the pixel electrode.

A conductive film 912 includes a part which functions as the gate electrode of the fifth thin film transistor 175. The conductive film 912 is connected to the first wiring 501 through a wiring 960 that is formed at the same time as the pixel electrode.

A conductive film 913 includes a part which functions as the second electrode of the sixth thin film transistor 176. The conductive film 913 is connected to the conductive film 903 through a wiring 957 that is formed at the same time as the pixel electrode.

A conductive film 914 includes a part which functions as the gate electrode of the seventh thin film transistor 177. The conductive film 914 is connected to the second wiring 502 through a wiring 962 that is formed at the same time as the pixel electrode.

A conductive film 915 includes a part which functions as the gate electrode of the eighth thin film transistor 178. The conductive film 915 is connected to the conductive film 912 through a wiring 961 that is formed at the same time as the pixel electrode.

A conductive film 916 includes a part which functions as the second electrode of the eighth thin film transistor 178. The conductive film 916 is connected to the conductive film 906 through a wiring 953 that is formed at the same time as the pixel electrode.

Parts of microcrystalline semiconductor films 981 to 988 function as channel formation regions of the first to eighth thin film transistors, respectively.

Now an external view and a cross section of a liquid crystal display panel, which is one mode of the display device of the present invention, is described with reference to FIGS. 20A and 20B. FIG. 20A is a top view of a panel in which a thin film transistor 4010 including a microcrystalline semiconductor film and a liquid crystal element 4013 that are formed over a first substrate 4001 are sealed with a sealant 4005 between the first substrate 4001 and a second substrate 4006. FIG. 20B is a cross-sectional view taken along a line A-A' of FIG. 20A.

The sealant 4005 is provided so as to surround a pixel portion 4002 and a scanning line driver circuit 4004 that are provided over the first substrate 4001. The second substrate 4006 is provided over the pixel portion 4002 and the scanning line driver circuit 4004. Thus, the pixel portion 4002 and the scanning line driver circuit 4004 are sealed, together with liquid crystal 4008, between the first substrate 4001 and the second substrate 4006 with the sealant 4005. A signal line driver circuit 4003 that is formed using a polycrystalline semiconductor film over a substrate which is prepared separately is mounted in a region that is different from the region surrounded by the sealant 4005 over the first substrate 4001. This embodiment mode describes an example of attaching the signal line driver circuit 4003 including a thin film transistor formed using a polycrystalline semiconductor film to the first substrate 4001. Alternatively, a signal line driver circuit may be formed using a thin film transistor including a single-crystalline semiconductor and attached to the first substrate 4001. FIG. 20B shows a thin film transistor 4009 that is formed using a polycrystalline semiconductor film and included in the signal line driver circuit 4003 as an example.

The pixel portion 4002 and the scanning line driver circuit 4004 that are formed over the first substrate 4001 each include a plurality of thin film transistors, and the thin film transistor 4010 included in the pixel portion 4002 is illustrated as an example in FIG. 20B. The thin film transistor 4010 corresponds to a thin film transistor including a microcrystalline semiconductor film.

In addition, a pixel electrode 4030 of a liquid crystal element 4013 is electrically connected to the thin film transistor 4010 through a source or drain electrode 4040 and a wiring 4041. A counter electrode 4031 of the liquid crystal element 4013 is formed on the second substrate 4006. The liquid crystal element 4013 corresponds to a region where the pixel electrode 4030 and the counter electrode 4031 sandwich the liquid crystal 4008.

The first substrate 4001 and the second substrate 4006 can be formed using glass, metal (a typical example is stainless steel), ceramics, or plastics. As plastics, a fiberglass-reinforced plastics (FRP) plate, a polyvinyl fluoride (PVF) film, a polyester film, or an acrylic resin film can be used. Further, sheet in which aluminum foil is sandwiched by PVF films or polyester films can also be used.

A spherical spacer 4035 is provided to control a distance (a cell gap) between the pixel electrode 4030 and the counter electrode 4031. A spacer which is obtained by patterning an insulating film may also be used.

A variety of signals and potential are supplied to the signal line driver circuit 4003 that is formed separately, the scanning line driver circuit 4004, or the pixel portion 4002 through leading wirings 4014 and 4015 from an FPC 4018.

In this embodiment mode, a connecting terminal 4016 is formed of the same conductive film as that of the pixel electrode 4030 included in the liquid crystal element 4013. In addition, the leading wirings 4014 and 4015 are formed of the same conductive film as that of the wiring 4041.

The connecting terminal 4016 is electrically connected to a terminal included in the FPC 4018 through an anisotropic conductive film 4019.

Although not illustrated, the liquid crystal display device shown in this embodiment mode includes an alignment film, a polarizing plate, and further, may include a color filter and a blocking film.

FIGS. 20A and 20B illustrate an example in which the signal line driver circuit 4003 is formed separately and mounted on the first substrate 4001, but this embodiment mode is not limited to this structure. The scanning line driver circuit may be formed separately and then mounted, or only a part of the signal line driver circuit or a part of the scanning line driver circuit may be formed separately and then mounted.

Figure 21A:
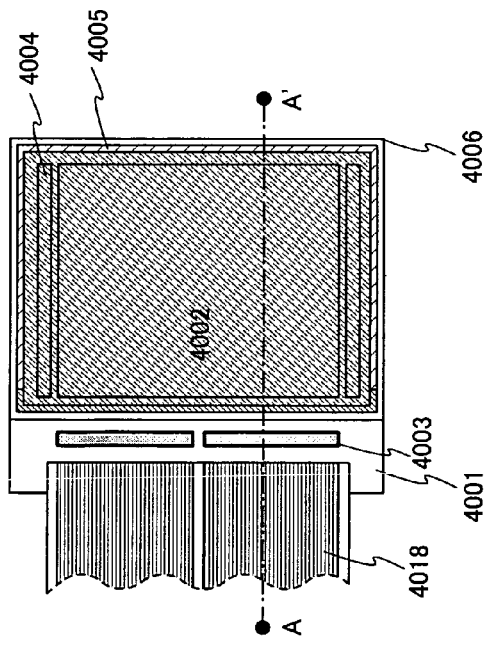
FIGS. 21A and 21B are a top view and a cross-sectional view, respectively, illustrating a light-emitting display panel.
Figure 21B:
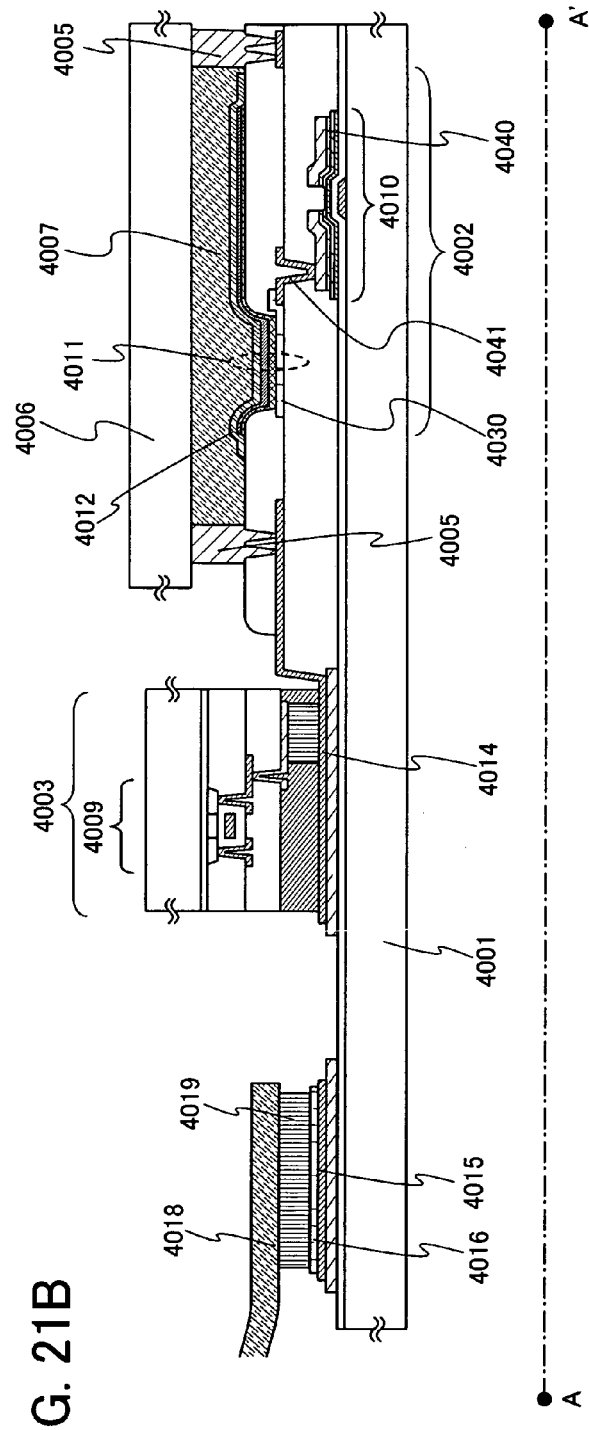

Now an external view and a cross section of a light-emitting display panel, which is one mode of the display device of the present invention, is described with reference to FIGS. 21A and 21B. FIG. 21A is a top view of a panel in which a thin film transistor including a channel formation region formed of a microcrystalline semiconductor film and a light-emitting element that are formed over a first substrate are sealed with a sealant between the first substrate and a second substrate. FIG. 21B is a cross-sectional view taken along a line A-A' of FIG. 21A.

A sealant 4005 is provided so as to surround a pixel portion 4002 and a scanning line driver circuit 4004 that are provided over a first substrate 4001. A second substrate 4006 is provided over the pixel portion 4002 and the scanning line driver circuit 4004. Thus, the pixel portion 4002 and the scanning line driver circuit 4004 as well as a filler 4007 are sealed with the sealant 4005 between the first substrate 4001 and the second substrate 4006. A signal line driver circuit 4003 that is formed using a polycrystalline semiconductor film over a substrate which is prepared separately is mounted in a region that is different from the region surrounded by the sealant 4005 over the first substrate 4001. This embodiment mode describes an example of attaching the signal line driver circuit 4003 including a thin film transistor including a polycrystalline semiconductor film to the first substrate 4001. Alternatively, a signal line driver circuit may be formed using a thin film transistor including a single-crystalline semiconductor and attached to the first substrate 4001. FIG. 21B shows a thin film transistor 4009 that is formed using a polycrystalline semiconductor film and included in the signal line driver circuit 4003 as an example.

The pixel portion 4002 and the scanning line driver circuit 4004 that are provided over the first substrate 4001 each include a plurality of thin film transistors. FIG. 21B shows a thin film transistor 4010 included in the pixel portion 4002 as an example. In this embodiment mode, the thin film transistor 4010 is illustrated as a driving TFT but may also be a current control TFT or an erasing TFT. The thin film transistor 4010 corresponds to a thin film transistor including a microcrystalline semiconductor film.

A light-emitting element 4011 includes a pixel electrode 4030 that functions as a first electrode, a light-emitting layer, and a second electrode 4012. The second electrode 4012 has a property of transmitting light. In addition, a pixel electrode 4030 of the light-emitting element 4011 is electrically connected to the source or drain electrode 4040 of the thin film transistor 4010 through a wiring 4041. The structure of the light-emitting element 4011 is not limited to the structure described in this embodiment mode. The structure of the light-emitting element 4011 can be changed as appropriate in accordance with a direction of light taken from the light-emitting element 4011, polarity of the thin film transistor 4010, or the like.

A variety of signals and potential which are applied to the signal line driver circuit 4003 that is formed separately, the scanning line driver circuit 4004, or the pixel portion 4002 are supplied from an FPC 4018 through a leading wiring 4014 and a leading wiring 4015, although not illustrated in the cross-sectional view of FIG. 21B.

In this embodiment mode, a connecting terminal 4016 is formed of the same conductive film as that of the pixel electrode 4030 included in the light-emitting element 4011. In addition, the leading wirings 4014 and 4015 are formed of the same conductive film as that of the wiring 4041.

The connecting terminal 4016 is electrically connected to a terminal included in the FPC 4018 through an anisotropic conductive film 4019.

A substrate located in a direction of extracting light from the light-emitting element 4011 needs to be transparent. In that case, a light-transmitting material such as a glass plate, a plastic plate, a polyester film, or an acrylic film is used.

As the filler 4007, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment mode, nitrogen is used as the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment may be carried out, by which reflected light can be diffused by projections and depressions on a surface, thereby reducing reflection.

FIGS. 21A and 21B illustrate an example in which the signal line driver circuit 4003 is formed separately and mounted on the first substrate 4001, but this embodiment mode is not limited to this structure. The scanning line driver circuit may be formed separately and then mounted, or only a part of the signal line driver circuit or a part of the scanning line driver circuit may be formed separately and then mounted.

This embodiment mode can be carried out in combination with a structure of another embodiment mode.

Embodiment Mode 3

Display devices such as liquid crystal display devices or light-emitting devices that are obtained according to the present invention can be used for a variety of modules (e.g., active matrix liquid crystal modules or active matrix EL modules). That is to say, the present invention can be carried out in all electronic devices in which these modules are incorporated into a display portion.

As such electronic devices, cameras such as video cameras and digital cameras; displays that can be mounted on a person's head (goggle-type displays); car navigation systems; projectors; car stereos; personal computers; portable information terminals (e.g., mobile computers, mobile phones, and electronic books); and the like can be given. Examples of these devices are illustrated in FIGS. 22A to 22C.

Figure 22A:
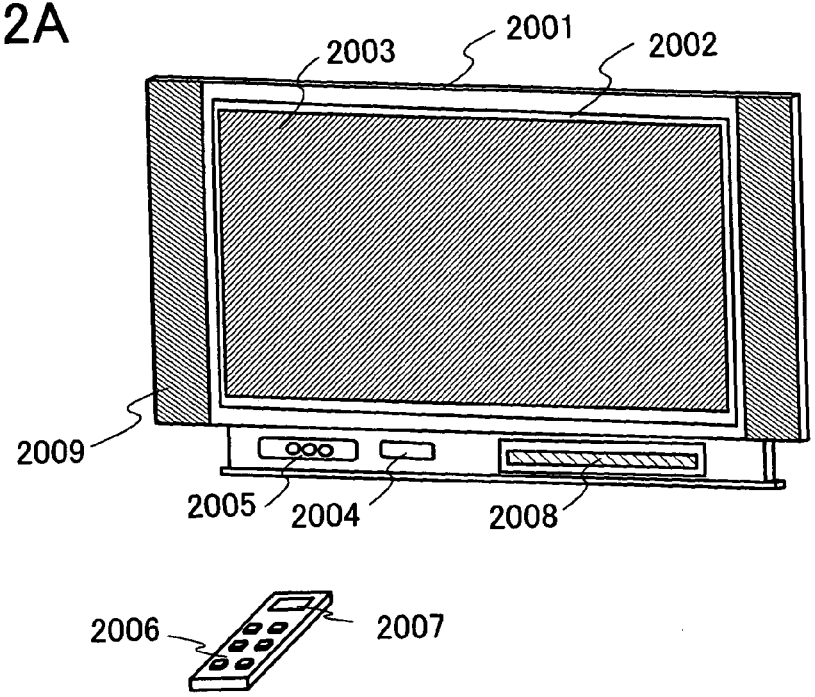
FIGS. 22A to 22C are perspective views of electronic devices including display devices according to the present invention.
Figure 22B:
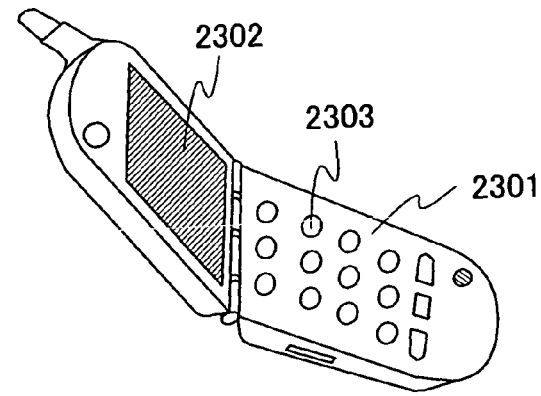
Figure 22C:
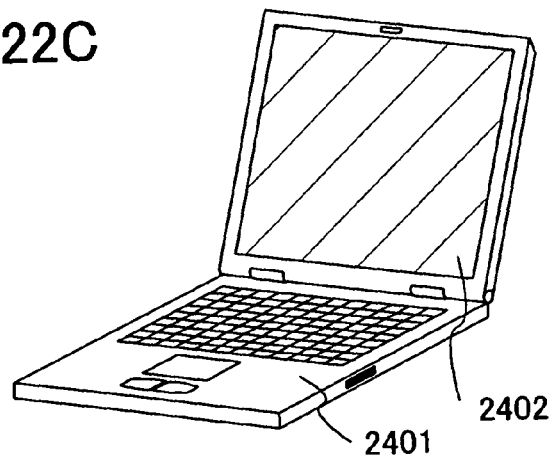

FIG. 22A illustrates a television device. A television device can be completed by incorporation of a display module into a chassis as illustrated in FIG. 22A. A display panel including components up to an FPC is also referred to as a display module. A main screen 2003 is formed with a display module. In addition, a speaker unit 2009, operation switches, and the like are provided as accessory equipment. In this manner, a television device can be completed.

As illustrated in FIG. 22A, a display panel 2002 including display elements is incorporated into a chassis 2001. In addition to reception of general television broadcast by a receiver 2005, communication of information in one direction (from a transmitter to a receiver) or in two directions (between a transmitter and a receiver or between receivers) can be performed by connection to a wired or wireless communication network through a modem 2004. The television device can be operated using switches that are incorporated into the chassis or by a remote control device 2006 that is provided separately, and a display portion 2007 that displays information which is output to this remote control device may be provided for the remote control device.

Further, in the television device, a sub-screen 2008 may be formed using a second display panel and used to display channel number, volume, and the like, in addition to the main screen 2003. In this structure, the main screen 2003 may be formed with a light-emitting display panel which has an excellent viewing angle, and the sub-screen 2008 may be formed with a liquid crystal display panel by which display with low power consumption is possible. Furthermore, in order to give priority to a shift toward lower power consumption, the main screen 2003 may be formed with a liquid crystal display panel, and the sub-screen 2008 may be formed with a light-emitting display panel, and the sub-screen 2008 may be configured to be capable of being flash on and off.

Needless to say, the present invention is not limited to a use for television devices, and can be applied to a variety of applications such as monitors for personal computers, or display media that have a large area, such as information display boards in railway stations, airports, and the like, or street-side advertisement display boards.

FIG. 22B illustrates one mode of a mobile phone 2301. The mobile phone 2301 includes a display portion 2302, operation switches 2303, and the like. The display device described in the preceding embodiment modes is applied to the display portion 2302, so that mass productivity can be improved.

A portable computer illustrated in FIG. 22C includes a main body 2401, a display portion 2402, and the like. The display device described in the preceding embodiment modes is applied to the display portion 2402, so that mass productivity can be improved.

This application is based on Japanese Patent Application serial No. 2007-159372 filed with Japan Patent Office on Jun. 15, 2007, the entire contents of which are hereby incorporated by reference.

What is claimed is:

1. A display device comprising:
   a thin film transistor comprising:
   a gate electrode;
   a gate insulating film formed over the gate electrode;
   a microcrystalline semiconductor film formed over the gate insulating film, the microcrystalline semiconductor film comprising a channel formation region;
   an antioxidant film formed on the microcrystalline semiconductor film, the antioxidant film comprising an end portion and a recessed portion overlapping the channel formation region;
   a pair of semiconductor films formed over the antioxidant film, the pair of semiconductor films including an impurity element imparting one conductivity type; and a source electrode and a drain electrode formed over the pair of semiconductor films, wherein edges of the source electrode and the drain electrode are aligned with edges of the pair of semiconductor films, wherein an edge of the antioxidant film is aligned with an edge of the microcrystalline semiconductor film, wherein the source electrode and the drain electrode do not overlap with a horizontal upper surface of the end portion of the antioxidant film, wherein the microcrystalline semiconductor film has crystal grains with a diameter of 0.5 nm to 20 nm inclusive in an amorphous semiconductor, wherein a thickness of the microcrystalline semiconductor film is 1 nm to 300 nm inclusive, wherein a thickness of the antioxidant film is 1 nm to 100 nm inclusive, and wherein the antioxidant film includes silicon and nitrogen.

2. The display device according to claim 1, wherein the source electrode and the drain electrode are in contact with the pair of semiconductor films, and wherein a pixel electrode is in contact with the source electrode or the drain electrode.

3. The display device according to claim 1, wherein the display device is a liquid crystal display device.

4. The display device according to claim 1, wherein the display device is a light-emitting device.

5. A display device comprising:
a thin film transistor comprising:
 a gate electrode;
 a gate insulating film formed over the gate electrode;
 a microcrystalline semiconductor film formed over the gate insulating film, the microcrystalline semiconductor film comprising a channel formation region;
 an amorphous semiconductor film formed on the microcrystalline semiconductor film, the amorphous semiconductor film comprising an end portion and a recessed portion overlapping the channel formation region;
 a pair of semiconductor films formed over the amorphous semiconductor film, the pair of semiconductor films including an impurity element imparting one conductivity type; and
 a source electrode and a drain electrode formed over the pair of semiconductor films, wherein edges of the source electrode and the drain electrode are aligned with edges of the pair of semiconductor films, wherein an edge of the amorphous semiconductor film is aligned with an edge of the microcrystalline semiconductor film, wherein the source electrode and the drain electrode do not overlap with a horizontal upper surface of the end portion of the amorphous semiconductor film, wherein the microcrystalline semiconductor film has crystal grains with a diameter of 0.5 nm to 20 nm inclusive in an amorphous semiconductor, wherein a thickness of the microcrystalline semiconductor film is 1 nm to 300 nm inclusive, wherein a thickness of the amorphous semiconductor film is 1 nm to 100 nm inclusive, and wherein the amorphous semiconductor film includes silicon and nitrogen.

6. The display device according to claim 5, wherein the source electrode and the drain electrode are in contact with the pair of semiconductor films, and wherein a pixel electrode is in contact with the source electrode or the drain electrode.

7. The display device according to claim 5, wherein the display device is a liquid crystal display device.

8. The display device according to claim 5, wherein the display device is a light-emitting device.

9. A display device comprising:
a thin film transistor comprising:
 a gate electrode;
 a gate insulating film formed over the gate electrode;
 a microcrystalline semiconductor film formed over the gate insulating film, the microcrystalline semiconductor film comprising a channel formation region;
 an antioxidant film formed on the microcrystalline semiconductor film, the antioxidant film comprising an end portion and a recessed portion overlapping the channel formation region;
 a pair of semiconductor films formed over the antioxidant film, the pair of semiconductor films including an impurity element imparting one conductivity type; and
 a source electrode and a drain electrode formed over the pair of semiconductor films, wherein edges of the source electrode and the drain electrode are aligned with edges of the pair of semiconductor films, wherein an edge of the antioxidant film is aligned with an edge of the microcrystalline semiconductor film, wherein the source electrode and the drain electrode do not overlap with a horizontal upper surface of the end portion of the antioxidant film, and wherein the antioxidant film includes silicon and nitrogen.

10. The display device according to claim 9, wherein the source electrode and the drain electrode are in contact with the pair of semiconductor films, and wherein a pixel electrode is in contact with the source electrode or the drain electrode.

11. The display device according to claim 9, wherein the display device is a liquid crystal display device.

12. The display device according to claim 9, wherein the display device is a light-emitting device.

13. A display device comprising:
a thin film transistor comprising:
 a gate electrode;
 a gate insulating film formed over the gate electrode;
 a microcrystalline semiconductor film formed over the gate insulating film, the microcrystalline semiconductor film comprising a channel formation region;
 an amorphous semiconductor film formed on the microcrystalline semiconductor film, the amorphous semiconductor film comprising an end portion and a recessed portion overlapping the channel formation region;
 a pair of semiconductor films formed over the amorphous semiconductor film, the pair of semiconductor films including an impurity element imparting one conductivity type; and
 a source electrode and a drain electrode formed over the pair of semiconductor films, wherein edges of the source electrode and the drain electrode are aligned with edges of the pair of semiconductor films, wherein an edge of the amorphous semiconductor film is aligned with an edge of the microcrystalline semiconductor film, wherein the source electrode and the drain electrode do not overlap with a horizontal upper surface of the end portion of the amorphous semiconductor film, and wherein the amorphous semiconductor film includes silicon and nitrogen.

14. The display device according to claim 13, wherein the source electrode and the drain electrode are in contact with the pair of semiconductor films, and wherein a pixel electrode is in contact with the source electrode or the drain electrode.

15. The display device according to claim 13, wherein the display device is a liquid crystal display device.

16. The display device according to claim 13, wherein the display device is a light-emitting device.

* * * * *